(12) United States Patent
Morioka

(10) Patent No.: US 8,457,457 B2
(45) Date of Patent: Jun. 4, 2013

(54) LENS ARRAY AND OPTICAL MODULE HAVING THE SAME

(75) Inventor: Shimpei Morioka, Saitama (JP)

(73) Assignee: Enplas Corporation, Saitama (JP)

(*) Notice: Subject to any disclaimer, the term of this patent is extended or adjusted under 35 U.S.C. 154(b) by 289 days.

(21) Appl. No.: 12/777,345

(22) Filed: May 11, 2010

(65) Prior Publication Data

US 2010/0295063 A1  Nov. 25, 2010

(30) Foreign Application Priority Data

May 11, 2009 (JP) ................................. 2009-114546

(51) Int. Cl.
*G02B 6/32* (2006.01)
*G02B 6/36* (2006.01)

(52) U.S. Cl.
USPC .................................. 385/33; 385/47; 385/93

(58) Field of Classification Search
USPC ......................... 385/33, 39, 47, 48, 88, 89, 93
See application file for complete search history.

(56) References Cited

U.S. PATENT DOCUMENTS

| | | | | |
|---|---|---|---|---|
| 4,701,010 A * | 10/1987 | Roberts | ........................... | 385/31 |
| 6,571,033 B2 * | 5/2003 | Caracci et al. | .................. | 385/24 |
| 6,636,540 B2 * | 10/2003 | Uebbing | .......................... | 372/36 |
| 6,888,988 B2 * | 5/2005 | Vancoille et al. | ................. | 385/47 |
| 6,892,007 B2 * | 5/2005 | Chen | ................................. | 385/48 |
| 6,959,133 B2 * | 10/2005 | Vancoill et al. | .................. | 385/47 |
| 2011/0097037 A1 * | 4/2011 | Kuznia et al. | .................... | 385/33 |

FOREIGN PATENT DOCUMENTS

| | | |
|---|---|---|
| JP | 2006-520491 A | 9/2006 |
| JP | 2006-344915 A | 12/2006 |
| JP | 2008-151894 A | 7/2008 |
| WO | WO2004/083926 A1 | 9/2004 |

* cited by examiner

*Primary Examiner* — Daniel Petkovsek
(74) *Attorney, Agent, or Firm* — Kubotera & Associates, LLC

(57) ABSTRACT

A lens array can have monitor light reliably and can be manufactured easily. With this lens array (2), a reflecting/transmission surface (15) of a first concave part (14) branches laser lights L having been emitted from light emitting elements (7) and having been incident on first lens surfaces (11), toward second lens surfaces (12) and third lens surfaces (13). Monitor lights M branched toward the third lens surfaces (13) are emitted from the third lens surfaces (13) toward first light receiving elements (8) passing through a refracting surface (19) of a second concave part (18). The lens array (2) is formed such that the optical axes on the first lens surfaces (11) and the optical axes on the third lens surfaces (13) are parallel, and the optical axes on the first lens surface (11) and the optical axes on the second lens surfaces (12) are parallel or vertical.

8 Claims, 18 Drawing Sheets

LENS ARRAY AND OPTICAL MODULE HAVING THE SAME

CROSS REFERENCE TO RELATED APPLICATIONS

The disclosure of Japanese Patent Application No. 2009-114546, filed on May 11, 2009, including the specification, drawings and abstract, is incorporated herein by reference in its entirety.

1. Technical Field

The present invention relates to a lens array and an optical module with this lens array. More particularly, the present invention relates to a lens array that is adequate to optically couple a plurality of light emitting elements and the end surfaces of a plurality of optical fibers, and an optical module using this lens array.

2. Background Art

Recently, as a technique of transmitting signals inside a system apparatus, between systems apparatuses or between optical modules at high speed, so-called optical interconnection is widely adopted. Here, optical interconnection refers to a technique of handling optical components as if they were electrical components, and mounting them on, for example, a mother board or circuit substrate used for a personal computer, vehicle, optical transceiver and the like.

An optical module used for such optical interconnection has various uses for internal connection of a media converter or switching hub, connection of components inside an apparatus or between apparatuses such as optical transceivers, medical equipment, test devices, video systems and high speed computer clusters.

In this optical module, communication information is transmitted through optical fibers by coupling light which includes communication information and which has been emitted from light emitting elements, to the end surfaces of optical fibers through lenses.

Further, some optical modules have light emitting elements and, in addition, light receiving elements for receiving light which includes communication information and which has been propagated through optical fibers and has been emitted from the end surfaces of the optical fibers.

Here, conventionally, it has been pointed out that, with such an optical module, the output performance of light emitting elements for emitting light changes due to the influence of, for example, the temperature and therefore there is a problem of disrupting adequate transmission of communication information.

So far, proposals have been made as to various techniques for monitoring light (particularly the intensity or the amount of light) emitted from light emitting elements in order to stabilize the output performance of the light emitting elements.

For example, Patent Literature 1 discloses an optical element that has, around the lens surface (i.e. transmission surface part), a reflecting surface (i.e. reflecting surface part) for reflecting part of lights emitted from light emitting elements toward light receiving elements.

Further, Patent Literature 2 discloses reflecting part of lights emitted from laser sources as monitor lights by a multi-interface beam splitter, and receiving reflected monitor lights in a detector.

Furthermore, Patent Literature 3 discloses an optical unit with an optical surface in which a total reflecting mirror that totally reflects laser lights emitted from surface emission lasers, toward optical fibers, continues to a notch part that reflects part of laser lights emitted from the surface emission lasers, toward a PD (photo-detector).

Citation List
Patent Literature
PTL 1: Japanese Patent Application Laid-Open No. 2008-151894
PTL 2: Japanese Patent Application Laid-Open No. 2006-520491
PTL 3: Japanese Patent Application Laid-Open No. 2006-344915

SUMMARY OF INVENTION

Technical Problem

In recent years, as small optical components for realizing multi-channel optical communication, a demand for lens arrays aligning a plurality of lenses in a predetermined direction is increasing. With an optical system with this lens array, a light emitting apparatus formed by aligning a plurality of light emitting elements is arranged such that light emitting elements are arranged to face the lens surfaces on the incidence side of the lens array and a plurality of optical fibers are arranged to face the lens surfaces on the emission side of the lens array. Then, by optically coupling light emitted from each light emitting element to the end surface of each optical fiber by each lens of the lens array, it is possible to perform multi-channel optical communication (i.e. transmission). Further, it is very important even for this lens array to monitor lights emitted from light emitting elements in order to secure stability in optical communication. With this lens array, each one of lenses is formed to have a very small diameter, and the pitches between adjacent lenses are made very narrow. Hence, with the technique of Patent Literature 1, it is necessary to form, around lenses of the lens array, a reflecting surface for reflecting light, and therefore it is difficult to realize multi-channel optical communication with a compact configuration.

With the optical module of Patent Literature 2, an acute angle is formed between the optical axis of a collimator lens facing a laser source and the optical axis of a focusing lens facing an optical detector, and therefore, to arrange the integrated optical module and the substrate on which the laser source and the optical detector are mounted, in a state where an optical path connecting the laser source and optical detector is adequately secured, there is a problem that the integrated optical module requires significant accuracy in measuring and is difficult to manufacture.

Further, the optical unit of Patent Literature 3 requires accurate positioning of the boundary between the total reflecting mirror and the notch part, and is difficult to manufacture similar to Patent Literature 2.

It is therefore an object of the present invention to provide a lens array that can have monitor light reliably and can be manufactured easily, and an optical module with this optical module.

Solution to Problem

The lens array according to the present invention employs a configuration which includes: a plurality of lens surfaces on which a plurality of lights each emitted from a plurality of light emitting elements arranged in parallel are incident; a reflecting/transmission surface which reflects part of lights emitted from the plurality of first lens surfaces, and allows a rest of lights to transmit; a first refracting surface which refracts traveling directions of the lights transmitted through the reflecting/transmission surface, so as to be parallel to the lights emitted from the plurality of first lens surfaces; a plurality of second lens surfaces which emit the lights refracted on the first refracting surface, toward end surfaces of a plurality of optical fibers arranged in parallel; a second refracting surface which refracts traveling directions of the lights reflected on the reflecting/transmission surface, so as to be parallel to the lights emitted from the plurality of first lens surfaces; and one or a plurality of third lens surfaces which emit the lights refracted on the second refracting surface, toward light receiving elements.

The optical module according to the present invention employs a configuration which includes: the above lens array; and a photoelectric converting device which has the plurality of laser sources, and which converts an optical signal to an electrical signal and converts an electrical signal to an optical signal.

Advantageous Effects of Invention

With the present invention, the first refracting surface is formed such that the optical axes on first lens surfaces and the optical axes on second lens surfaces are parallel, and the optical axes on the first lens surfaces and the optical axes on third lens surfaces are parallel. By this means, it is possible to relax accuracy in measuring required for lens arrays, and, consequently, have monitor lights (i.e. lights emitted from third lens surfaces) reliably and manufacture lens arrays easily.

DESCRIPTION OF EMBODIMENTS (Embodiment 1)

Hereinafter, Embodiment 1 of a lens array and an optical module with this lens array of the present invention will be explained with reference to FIG. 1 to FIG. 5.

Figure 1:
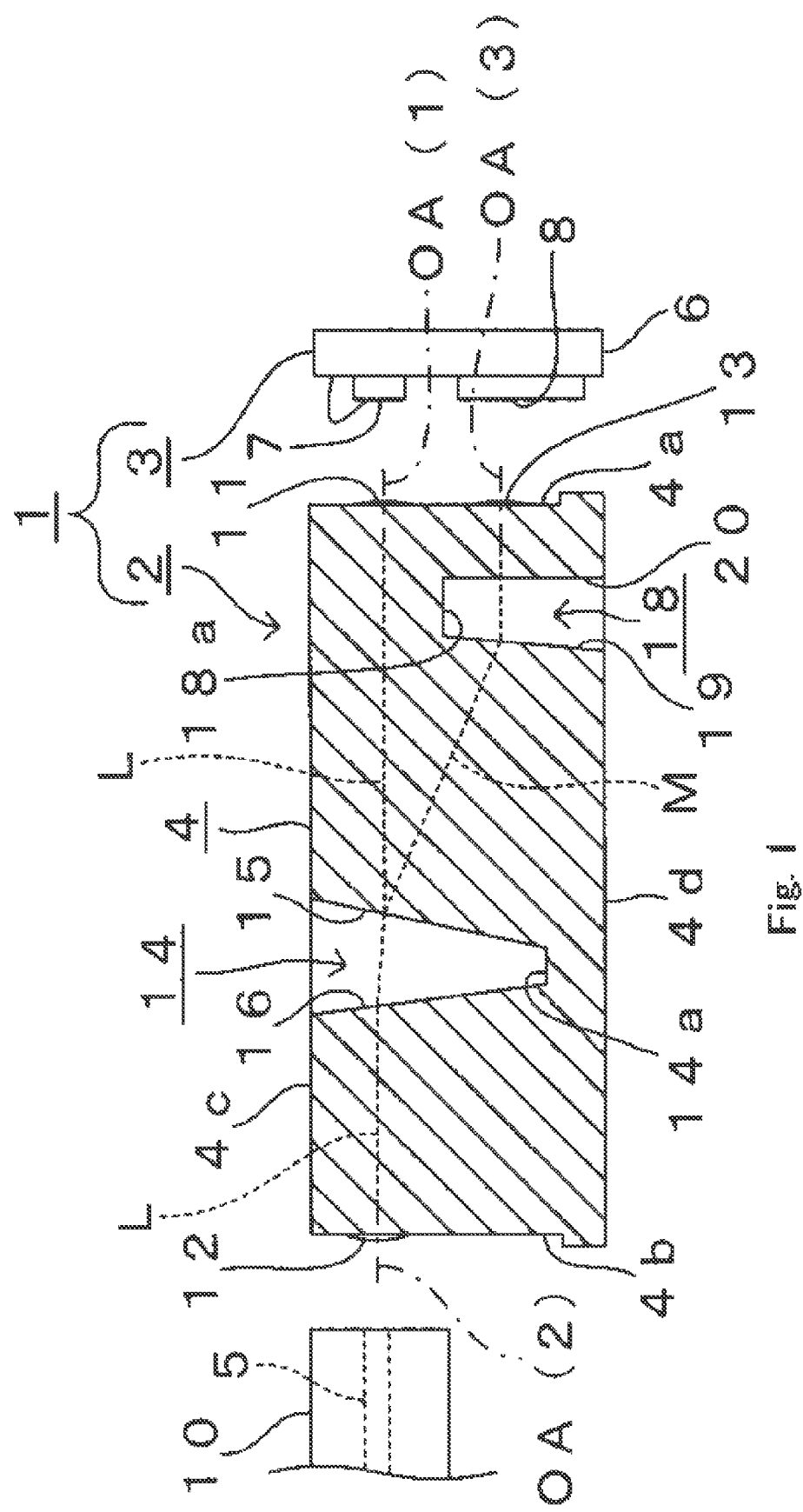
FIG. 1 is a schematic configuration diagram showing an overview of an optical module and a vertical cross-sectional view of a lens array according to Embodiment 1 of the lens array and the optical module with this lens array of the present invention.
Figure 2:
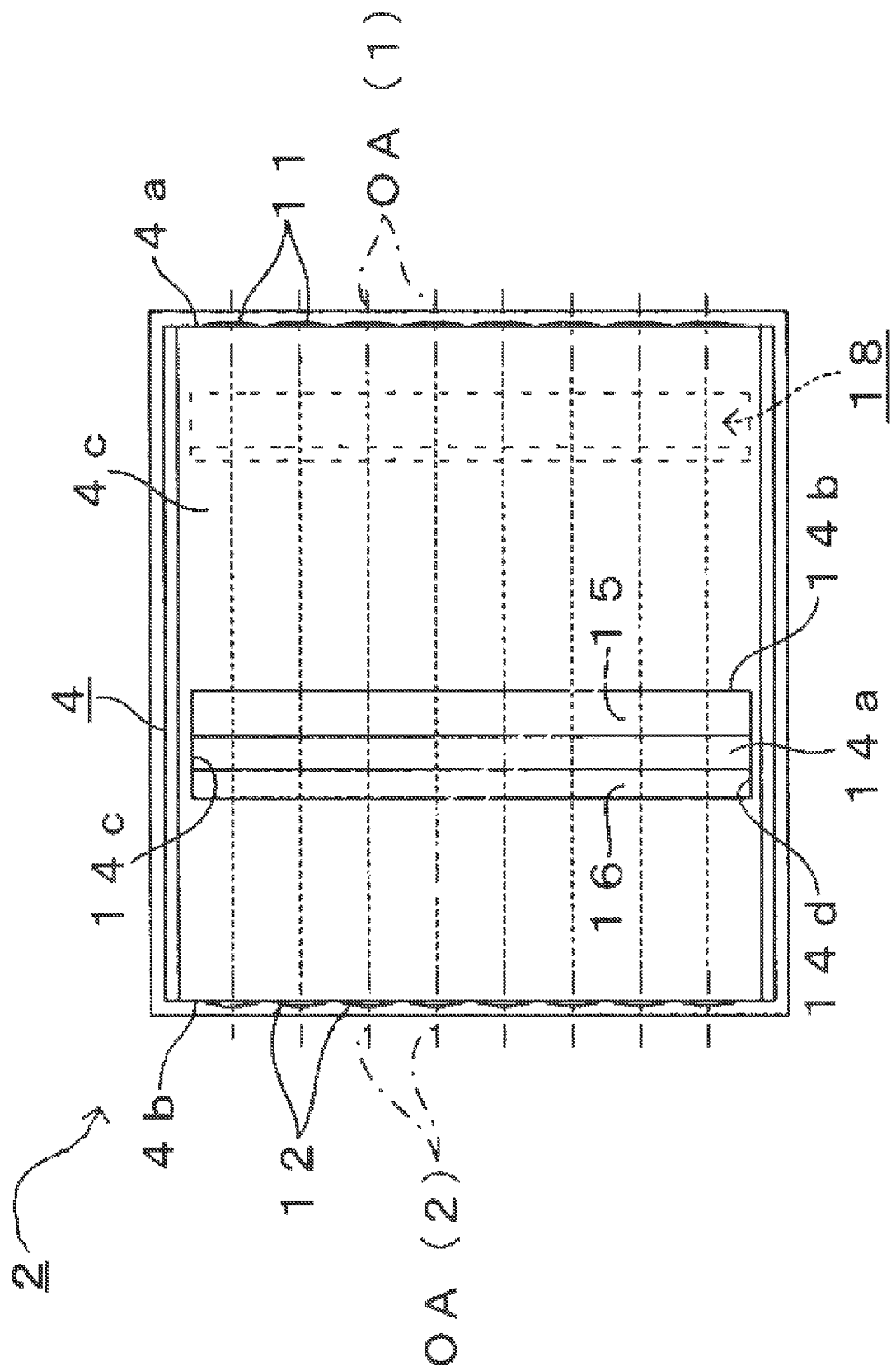
FIG. 2 is a plan view showing a lens array according to Embodiment 1 of the lens array and an optical module with this lens array of the present invention.
Figure 3:
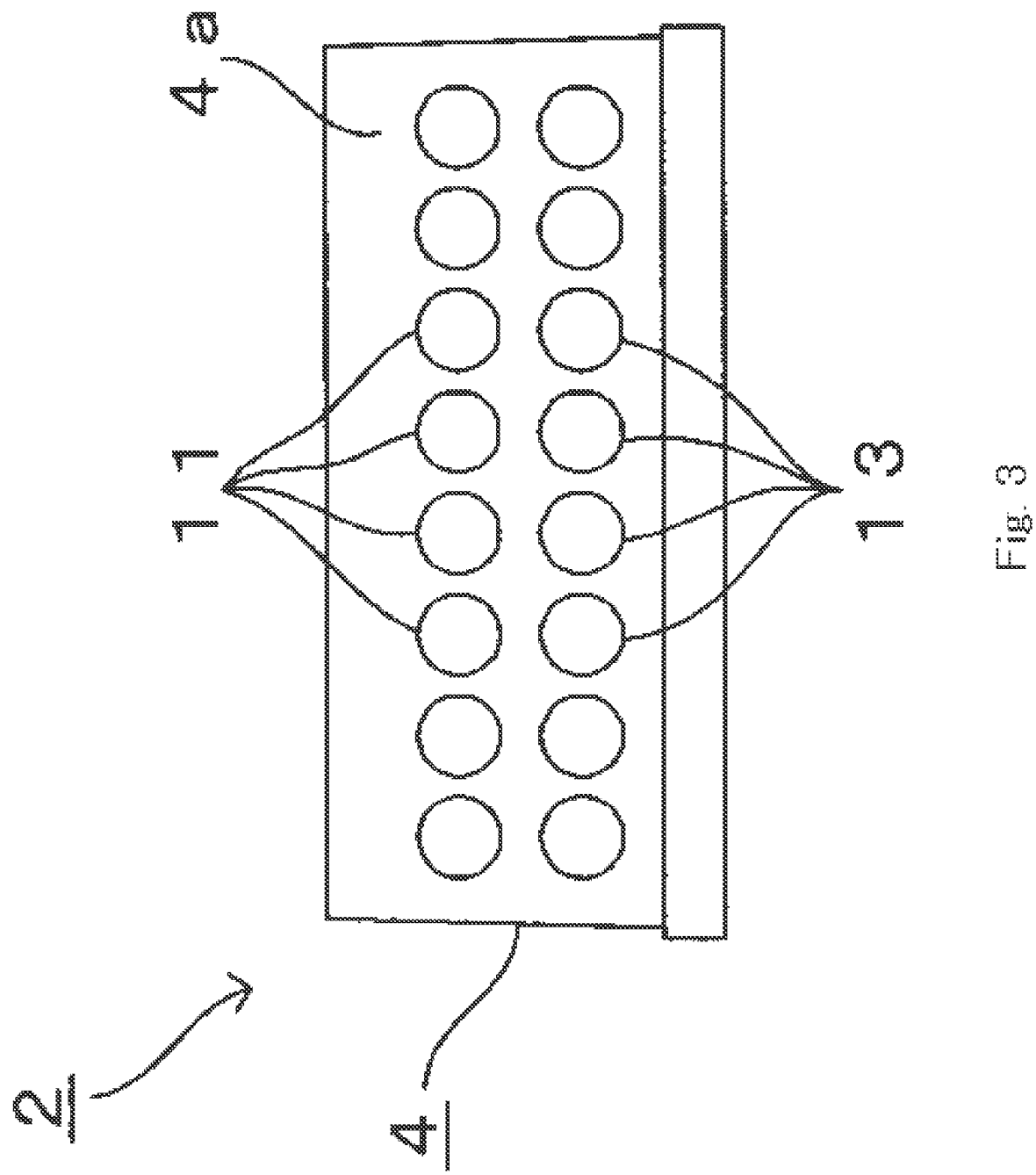
FIG. 3 is a right-side view of FIG. 2.
Figure 4:
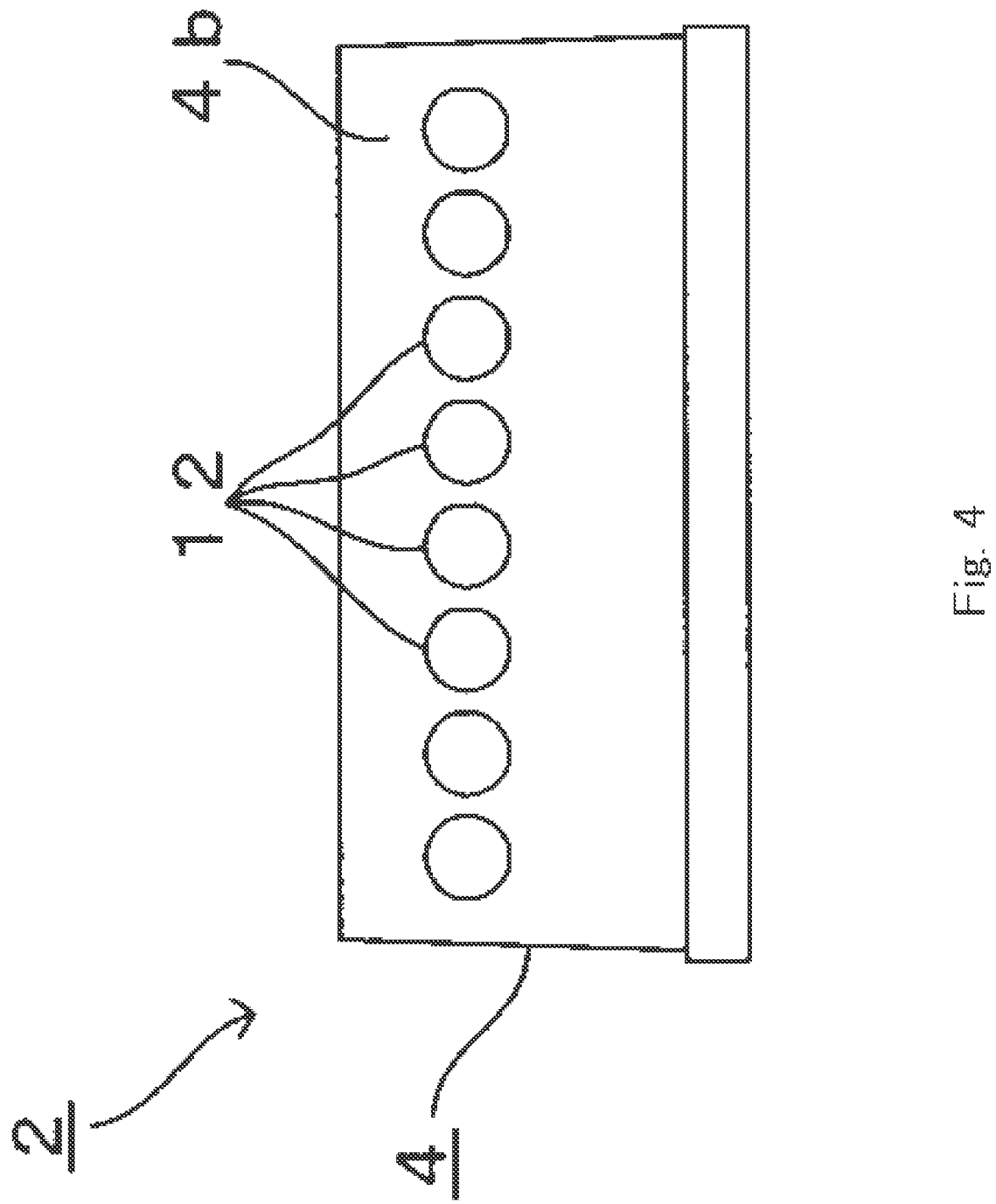
FIG. 4 is a left-side view of FIG. 2.
Figure 5:
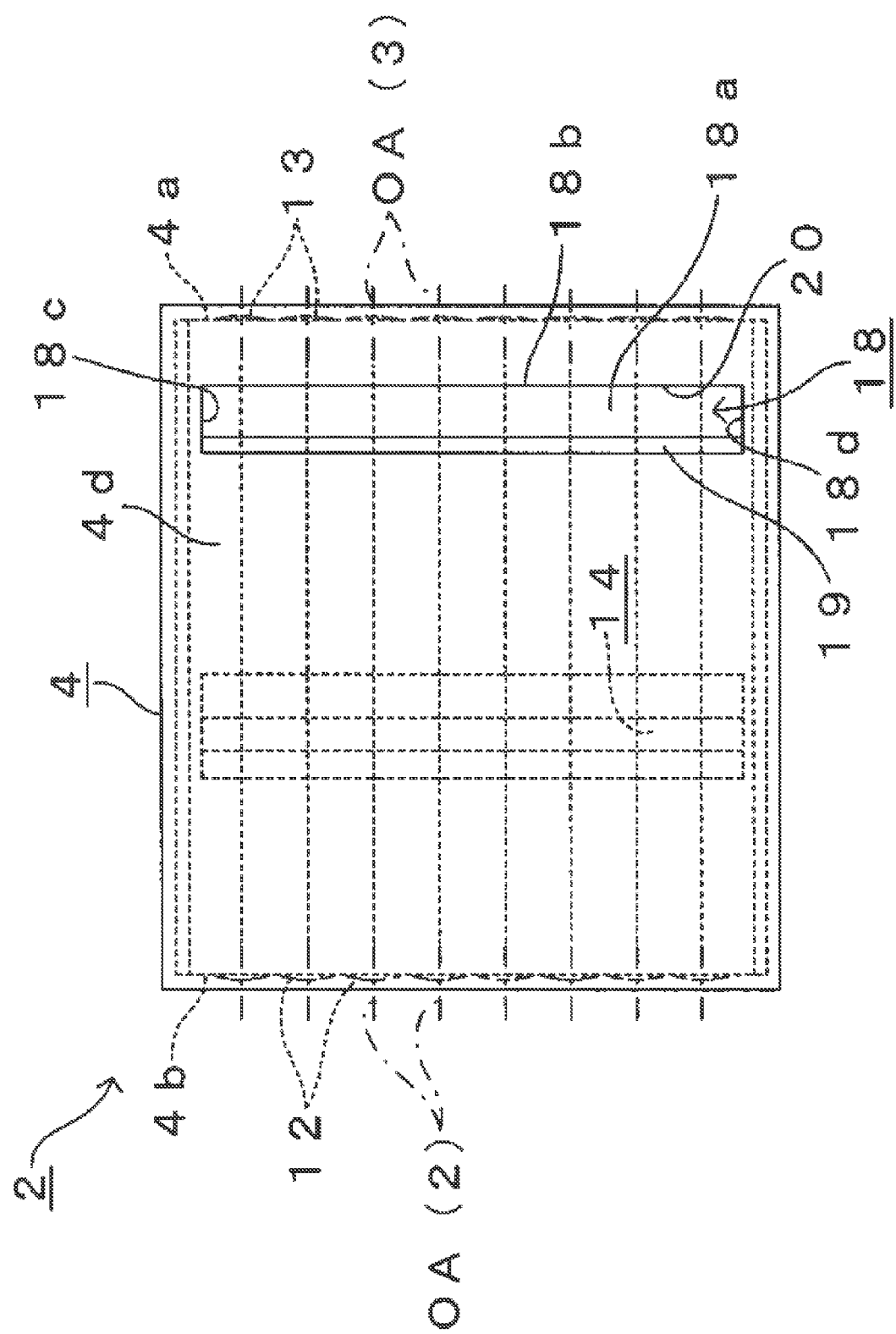
FIG. 5 is a bottom view of FIG. 2.

FIG. 1 is a schematic configuration diagram showing an overview of optical module 1 of the present embodiment and a vertical cross-sectional view of lens array 2 of the present embodiment. FIG. 2 is a plan view of lens array 2 shown in FIG. 1. FIG. 3 is a right-side view of FIG. 2. FIG. 4 is a left-side view of FIG. 2. FIG. 5 is a bottom view of FIG. 2.

As shown in FIG. 1, lens array 2 of the present embodiment is arranged between photoelectric converting device 3 and optical fibers 5 (i.e. the first optical fibers).

Photoelectric converting device 3 converts optical signals to electrical signals or converts electrical signals to optical signals, and has, in the surface of semiconductor substrate 6 facing lens array 2, a plurality of light emitting elements 7 (i.e. laser sources) that emit laser lights L (that emit lights) vertically (in the left direction in FIG. 1) with respect to this surface. A plurality of light emitting elements 7 form vertical cavity surface emitting laser ("VCSEL"). Note that, in FIG. 1, light emitting elements 7 are formed and aligned at equal intervals in the vertical direction in FIG. 1. Further, photoelectric converting device 3 has the same number of light receiving elements 8 (i.e. first light receiving elements) as light emitting elements 7, in the position below and near each light emitting element 7 on the surface of semiconductor substrate 6 facing lens array 2 in FIG. 1. Each light receiving element 8 receives monitor light M that is branched from laser light L emitted from each light emitting element 7 and that is used to monitor the output (for example, the intensity or amount of light) of laser light L. Note that light receiving elements 8 are formed and aligned at the same pitches as light emitting elements 7 in the vertical direction in FIG. 1. These light receiving elements 8 may be photo-detectors. Further, although not shown, photoelectric converting device 3 is connected with a control circuit that controls the output of laser lights L emitted from light emitting elements 7 based on monitor lights M received in light emitting elements 8. Photoelectric converting device 3 is arranged to face lens array 2 such that the surface of semiconductor substrate 6 facing lens array 2 abuts on the abutting surface (not shown) of lens array 2. Then, photoelectric converting device 3 is fixed to lens array 2 by a fixing means that is publicly known.

Further, the same number of optical fibers 5 of the present embodiment as light emitting elements 7 are disposed, and, in FIG. 1, optical fibers 5 are formed and aligned at the same pitches as light emitting elements 7, in the vertical direction in FIG. 1. Each optical fiber 5 is attached to lens array 2 by a fixing means that is publicly known, in a state where a part on the end surface side of optical fiber 5 is held inside bulk multicore connector 10.

Then, in a state where lens array 2 is arranged between photoelectric converting device 3 and optical fibers 5, lens array 2 optically couples each light emitting element 7 and the end surface of each optical fiber 5.

This lens array 2 will be described in more detail below. As shown in FIG. 1, lens array 2 has lens array body 4. Lens array body 4 is formed such that its outer shape of the vertical cross-section has virtually a rectangular shape. Further, as shown in FIG. 2, lens array body 4 is formed such that its shape seen from a plan view has virtually a rectangular shape. Furthermore, as shown in FIG. 3 and FIG. 4, lens array body 4 is formed such that its lateral shape has virtually a trapezoidal shape.

As shown in FIG. 1 to FIG. 3 and FIG. 5, lens array 2 has the same number of (i.e. eight) circular first lens surfaces 11 (i.e. convex lens surfaces) as light emitting elements 7, on right end surface 4a (i.e. first surface) of lens array 4 in FIG. 1 facing photoelectric converting device 3. First lens surfaces 11 are formed and aligned in positions to face light emitting elements 7. Laser light L having been emitted from each applicable light emitting element 7 is incident on each first lens surface 11. Then, each first lens surface 11 collimates and then allows incident laser light L to travel toward the interior of lens array body 4.

Further, as shown in FIG. 1, FIG. 2 and FIG. 4, lens array 2 has the same number of (i.e. eight) circular second lens surfaces 12 (i.e. convex lens surfaces) as first lens surfaces 11, on left end surface 4b (i.e. second surface) of lens array body 4 in FIG. 1 facing the end surfaces of optical fibers 5. Second lens surfaces 12 are formed and aligned in positions to match first lens surfaces 11. Each second lens surface 12 emits laser light L having been incident on each applicable first lens surface 11 and having traveled through an optical path inside lens array body 4, toward the end surface of each applicable optical fiber 5.

By so doing, each light emitting element 7 and the end surface of optical fiber 5 are optically coupled through first lens surface 11 and second lens surface 12.

Further, as shown in FIG. 1 to FIG. 3 and FIG. 5, in the vicinity of the lower part of right end surface 4a of lens array body 4 matching first lens surfaces 11 in FIG. 1, the same number of (i.e. eight) circular third lens surfaces 13 (i.e. convex lens surfaces) as light emitting elements 8 are formed. Third lens surfaces 13 are formed in positions to match light emitting elements 8. Each third lens surface 13 emits monitor light M having been branched from laser light L emitted from each applicable light emitting element 7 inside lens array body 4, toward each applicable light emitting element 8.

Further, as shown in FIG. 1, in upper end surface 4c of lens array body 4 in FIG. 1, first concave part 14 is formed on the optical paths connecting first lens surfaces 11 and second lens surfaces 12.

As shown in FIG. 1, in first concave part 14, flat reflecting/transmission surface 15 forming part of the lateral surface (i.e. right side surface in FIG. 1) of this first concave part 14 is formed. Reflecting/transmission surface 15 is formed in an inclined surface such that the upper end side and lower end side of reflecting/transmission surface 15 in FIG. 1 are parallel to the direction in which first lens surface 11 are aligned and the upper end side is positioned closer to photoelectric converting device 3 than the lower end side, and the planar normal line of reflecting/transmission surface 15 is inclined with respect to optical axes OA (1) on first lens surfaces 11 of lens array 2. Laser light L having been incident on each first lens surface 11 and having traveled inside lens array body 4 is incident on reflecting/transmission surface 15. Then, reflecting/transmission surface 15 reflects each incident laser light L, toward third lens surfaces 13 at a predetermined reflectivity by Fresnel reflection, and allows each laser light L to transmit at a predetermined transmittance toward the optical paths for second lens surfaces 12. At this time, part of laser lights L (i.e. the amount of light in proportion to the reflectivity) reflected on reflecting/transmission surface 15 become monitor lights M. Note that, in case where lens array 2 is formed only with polyetherimide, reflecting/transmission surface 15 reflects laser lights L having been incident from first lens surfaces 11, at reflectivity 5.88 [%] (where loss in the amount of light is −12.3 [dB]), and allows the rest of laser lights L to transmit. Further, each laser light L that is allowed to transmit through reflecting/transmission surface 15 is refracted according to Snell's law.

Further, as shown in FIG. 1, in first concave part 14, flat first refracting surface 16 that forms part of the lateral surface (the left side surface in FIG. 1) in first concave part 14 is formed in a position to allow laser light L to transmit to reflecting/transmission surface 15. First refracting surface 16 is formed in an inclined surface such that the upper end side and the lower end side of first refracting surface 16 in FIG. 1 are parallel to the direction in which first lens surfaces 11 are aligned and the upper end side is positioned closer to optical fibers 5 than the lower end side, and the planar normal line of refracting surface 16 is inclined with respect to optical axes OA (2) on second lens surfaces 12 of lens array 2. Note, with the present embodiment, the angle formed between first refracting surface 16 and upper end surface 4c of lens array 2 is closer to 90 degrees compared to reflecting/transmitting surface 15. Each laser light L having transmitted through reflecting/transmission surface 15 and traveled inside space (i.e. air) formed by first concave part 14, is incident on first refracting surface 16. Then, first refracting surface 16 refracts each incident laser light L and allows transmission of each laser light L according to Snell's law such that its traveling direction matches optical axes OA (2) on applicable second lens surfaces 12. Note that each laser light L refracted on first refracting surface 16 travels leftward as light parallel to the horizontal direction in FIG. 1. Then, each laser light L having been refracted on this first refracting surface 16 is emitted from each applicable second lens surface 12 toward the end surface of each applicable optical fiber 5, and is received in the end surface of each optical fiber 5.

Further, as shown in FIG. 1, in lower end surface 4d of lens array body 4 in FIG. 1, second concave part 18 is formed on the optical paths connecting first lens surfaces 11 and second lens surfaces 12.

As shown in FIG. 1, in second concave part 18, second refracting surface 19 that forms part of the lateral surface (i.e. left side surface in FIG. 1) of this second concave part 18 is formed. Second refracting surface 19 is formed in an inclined surface such that the upper end side and the lower end side of second refracting surface 19 in FIG. 1 are parallel to the direction in which third lens surfaces 13 are aligned and the upper end side is positioned closer to photoelectric converting device 3 than the lower end side, and the planar normal line of second refracting surface 19 is inclined with respect to optical axes OA (3) on third lens surfaces 13 of lens array 2. Each monitor light M having been reflected on reflecting/transmission surface 15 and having traveled inside lens array body 4 is incident on second refracting surface 19. Then, second refracting surface 19 refracts each incident monitor light M and allows transmission of each incident monitor light M according to Snell's law such that its traveling direction matches optical axes OA (3) on applicable third lens surfaces 13. Note that, although part of monitor lights M (i.e. the amount of light corresponding to Fresnel reflection) having been incident on second refracting surface 19 is lost (by −0.26

[dB] in case where lens array 2 is formed only with polyetherimide), large part of monitor lights M travel toward third lens surfaces 13.

Further, as shown in FIG. 1, in second concave part 18, transmission plane 20 that forms part of the lateral surface (i.e. the right side surface in FIG. 1) of this second concave part 18 is formed. Transmission surface 20 is formed in parallel to optical axes OA (3) on third lens surfaces 13, and is formed vertically with respect to lower end surface 4d of lens array body 4. In this transmission surface 20, each monitor light M having been refracted on second refracting surface 19 and having traveled inside space (i.e. air) formed by second concave part 18 vertically is incident on transmission surface 20. Then, transmission surface 20 allows each incident monitor light M to transmit toward each third lens surface 13 matching each light emitting element 7. At this time, although part of monitor lights M (the amount of light corresponding to Fresnel reflection) having been incident on transmission surface 20 are lost (by −0.26 [dB] in case where lens array 2 is formed only with polyetherimide), large part of monitor lights M travel toward third lens surfaces 13. Further, with the present invention, only second refracting surface 19 needs not necessarily make the traveling direction of each monitor M match optical axes OA (3) on third lens surfaces 13, by forming the shape (i.e. inclination) of transmission surface 20 such that each monitor light M is refracted, and it is equally possible to make the traveling direction of each monitor light M match optical axes OA (3) on the third lens surfaces 13 by refraction on both second refracting surface 19 and transmission surface 20.

Then, each monitor light M having transmitted through transmission surface 20 is emitted from each applicable third lens surface 13 toward each applicable light receiving element 8, and is received by each light receiving element 8. Note that the amount of each monitor light M received by each light receiving element 8 is −12.8 [dB] in case where lens array 2 is formed with polyetherimide. Here, light receiving elements 8 such as photo-detectors can generally detect light at the level of −20 [dB], and therefore the amount of monitor light M is enough to perform detection in light receiving elements 8.

Further, as shown in FIG. 2, lens array 2 is formed such that optical axes OA (1) on first lens surfaces 11 are parallel. Furthermore, lens array 2 is formed such that optical axes OA (2) on second lens surfaces 12 are parallel. Still further, lens array 2 is formed such that optical axes OA (1) on first lens surfaces 11 and optical axes OA (3) on third lens surfaces 13 are parallel. Moreover, lens array 2 is formed such that optical axes OA (1) on first lens surfaces 11 and optical axes OA (2) on second lens surfaces 12 are parallel. Note that optical axes OA (2) on second lens surfaces 12 are positioned slightly above optical axes OA (1) on first lens surfaces 11 in FIG. 1. Further, optical axes OA (1) on first lens surfaces 11 match the center axes of laser lights L emitted from light emitting elements 7. Furthermore, optical axes OA (2) on second lens surfaces 12 match the center axes of the end surfaces of optical fibers 5 matching second lens surfaces 12 Still further, optical axes OA (3) on third lens surfaces 13 match the center axes of the light receiving surfaces of light emitting elements 8 matching third lens surfaces 13.

Thus, with the present embodiment, laser light L having emitted from each light emitting element 7 and having been incident on first lens surfaces 11 is branched through reflecting/transmission surface 15 toward second lens surfaces 12 and third lens surfaces 13, and monitor lights M branched toward third lens surfaces 13 are emitted from third lens surfaces 13 toward light emitting elements 8 through second refracting surface 19. By this means, it is possible to have monitor lights M in light receiving elements 8 reliably.

Further, with the present embodiment, first refracting surface 16 is formed such that optical axes (1) on first lens surfaces 11 and optical axes OA (2) on second lens surfaces 12 are parallel, and second refracting surface 19 is formed such that optical axes OA (1) on first lens surfaces 11 and optical axes OA (3) on third lens surfaces 13 are parallel. By this means, it is possible to relax accuracy in measuring required by lens array 2 in order to secure the optical paths connecting light emitting elements 7 and light receiving elements 8 and the optical paths connecting light emitting elements 7 and the end surfaces of optical fibers 5, and manufacture lens arrays easily. If lens array 2 is formed such that optical axes OA (3) on third lens surfaces 13 have an acute inclination with respect to optical axes OA (1) on the first lens surfaces 11, a little measurement error in the horizontal direction in FIG. 1 produces a possibility that monitor lights M emitted from third lens surfaces 13 are not coupled to light receiving elements 8. By contrast with this, with the present embodiment, even if a little measurement error occurs in lens array 2 in the horizontal direction in FIG. 1, monitor lights M emitted from third lens surfaces 13 slightly increase or decrease their beam diameters with respect to the design value, so that lights are adequately received by light receiving elements 8. Further, if lens array 2 is formed such that optical axes OA (2) on second lens surfaces 12 have an acute inclination with respect to optical axes OA (1) on first lens surfaces 11, a little measurement error in the horizontal direction in FIG. 1 produces the possibility that laser lights L emitted from second lens surfaces 12 are not coupled to the end surfaces of optical fibers 5. By contrast with this, with the present embodiment, even if a little measurement error occurs in lens array 2 in the horizontal direction in FIG. 1, laser lights L emitted from second lens surfaces 12 slightly increase or decrease their beam diameters with respect to the design value, so that lights are adequately received by the end surfaces of optical fibers 5. Consequently, with lens array 2 according to the present embodiment, it is possible to set a great tolerance compared to the configuration disclosed in Patent Literature 2.

Further, with the present embodiment, as shown in FIG. 1, right end surface 4a of lens array 2 is formed in a flat surface vertical to optical axes OA (1) on first lens surfaces 11, and left end surface 4b of lens array 2 is formed in a flat surface vertical to optical axes OA(2) on second lens surfaces 12.

According to this configuration, it is possible to simplify the shape of right end surface 4a and the shape of left end surface 4b, and manufacture lens arrays 2 more easily.

Further, with the present embodiment, as shown in FIG. 1, second concave part 18 is formed in a position outside the optical paths connecting first lens surfaces 11 and second lens surfaces 12.

According to this configuration, it is not necessary to design the optical paths connecting first lens surfaces 11 and second lens surfaces 12 taking into account the presence of second concave part 18, so that it is possible to manufacture lens arrays 2 more easily.

Further, with the present embodiment, as shown in FIG. 1 and FIG. 2, when seen from the planar normal direction (that is, from above in FIG. 1) of upper end surface 4c in lens array body 4, first concave part 14 is formed in a shape in which bottom surface 14a (i.e. lower end surface in FIG. 1) and all lateral surfaces 15, 16, 14c and 14d in first concave part 14 are accommodated within the area defined by the outer shape of opening part 14b in first concave part 14. In other words, first concave part 14 is formed such that the projected surfaces of bottom surface 14a and all lateral surfaces 15, 16, 14c and 14d in the planar normal direction of upper end surface 4c are accommodated within the area defined by the outer shape of opening part 14b (that is, such that the cross-section area gradually decreases from the opening part toward the depths). Note that, as shown in FIG. 2, opening part 14b is formed in an elongated rectangular shape in the vertical direction in FIG. 2, and is surrounded by upper end surface 4c of lens array body 4 on all sides. Further, lateral surfaces 14c and 14d other than reflecting/transmission surface 16 and first refracting surface 15 are formed vertically with respect to upper end surface 4c of lens array body 4.

Further, with the present embodiment, as shown in FIG. 1 and FIG. 5, when seen from the planar normal direction (i.e. from below in FIG. 1) of lower end surface 4d of lens array body 4, second concave part 18 is formed in a shape in which bottom surface 18a (i.e. upper end surface in FIG. 1) and all lateral surfaces 19, 20, 18c and 18d in second concave part 18 are accommodated within the area defined by the outer shape of opening part 18b in second concave part 18. In other words, second concave part 18 is formed such that projected surfaces of bottom surface 18a and all lateral surfaces 19, 20, 18c and 18d in the planar normal direction of lower end surface 4d are accommodated within the area defined by the outer shape of opening part 18b. Note that, as shown in FIG. 5, opening part 18b is formed in an elongated rectangular shape in the vertical direction in FIG. 5, and is surrounded by lower end surface 4d of lens array body 4 on all sides. Further, lateral surfaces 18c and 18d other than second refracting surface 19 and transmission surface 20 are formed vertical to lower end surface 4d of lens array body 4.

According to this configuration, first concave part 14 and second concave part 18 are formed in shapes that secure demoldability from molds, so that it is possible to efficiently manufacture lens arrays 2 using molds.

Further, accompanying this, with the present embodiment, it is possible to integrally form (i.e. mold) lens arrays 2 using the same resin material (for example, polyetherimide).

Note that, with the present invention, it is equally possible to form a half mirror, which is publicly known, in reflecting/transmission surface 15, and forms a anti-reflecting film, which is publicly known, (that is, apply AR coating) in at least one of first refracting surface 16, second refracting surface 19 and transmission surface 20.

Further, with the present invention, the same number of third lens surfaces 13 and applicable light receiving elements 8 of these third lens surfaces 13 as light emitting elements 7 need not to be provided, and only at least one set of third lens surface 13 and corresponding light receiving element 8 needs to be provided. In this case, only laser lights arriving applicable third lens surfaces 13 among laser lights having been emitted from light emitting elements 7 and having been incident on first lens surfaces 11, are reflected as monitor lights on reflecting/transmission surface 15, so that the other laser lights are not used as monitor lights although they are reflected.

(Embodiment 2)

Next, the difference of Embodiment 2 of a lens array and an optical module with this lens array of the present invention from above Embodiment 1 will be mainly explained with reference to FIG. 1 to FIG. 5.

Figure 6:
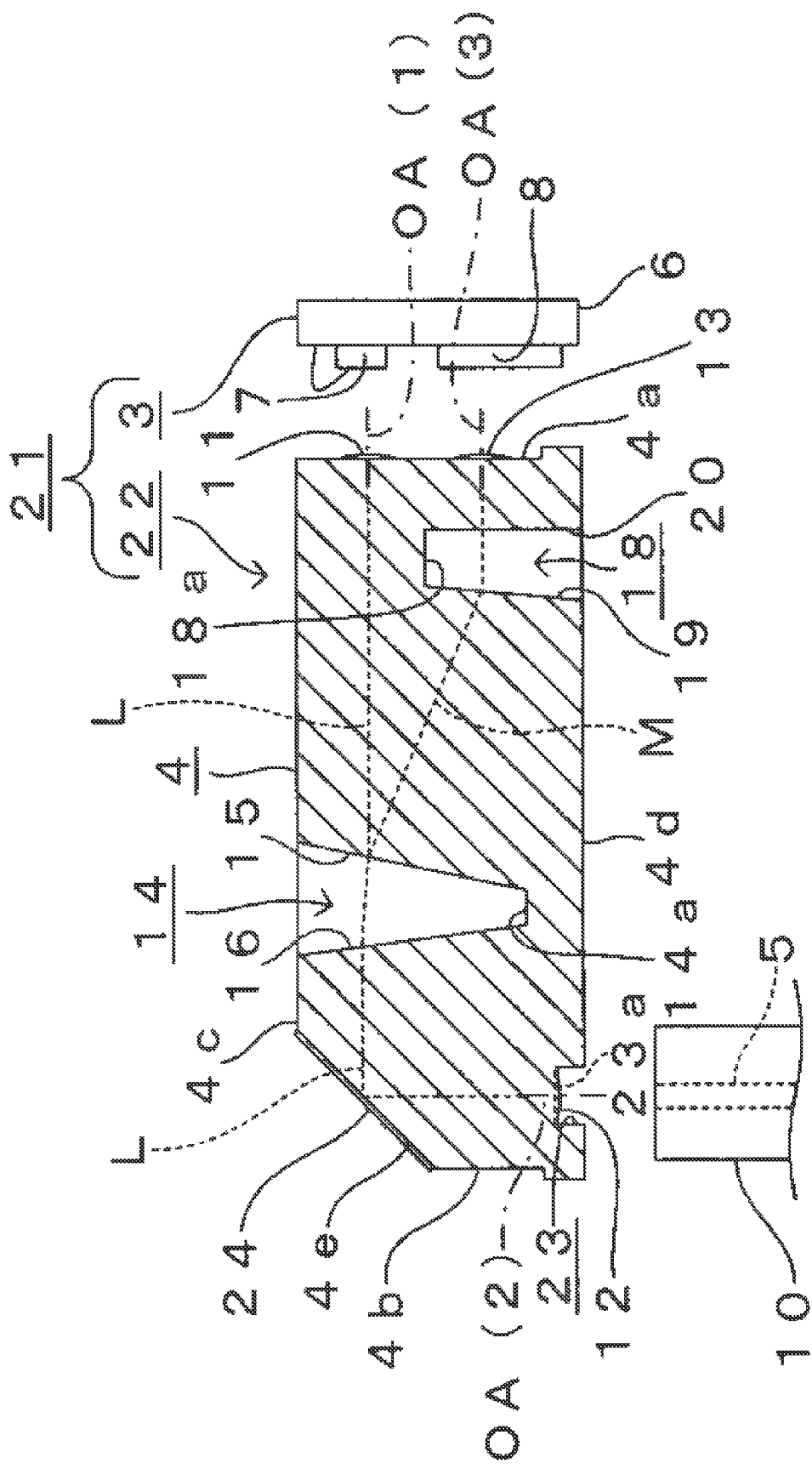
FIG. 6 is a schematic configuration diagram showing an overview of an optical module and a vertical cross-sectional view of a lens array according to Embodiment 2 of the lens array and the optical module with this lens array of the present invention.
Figure 7:
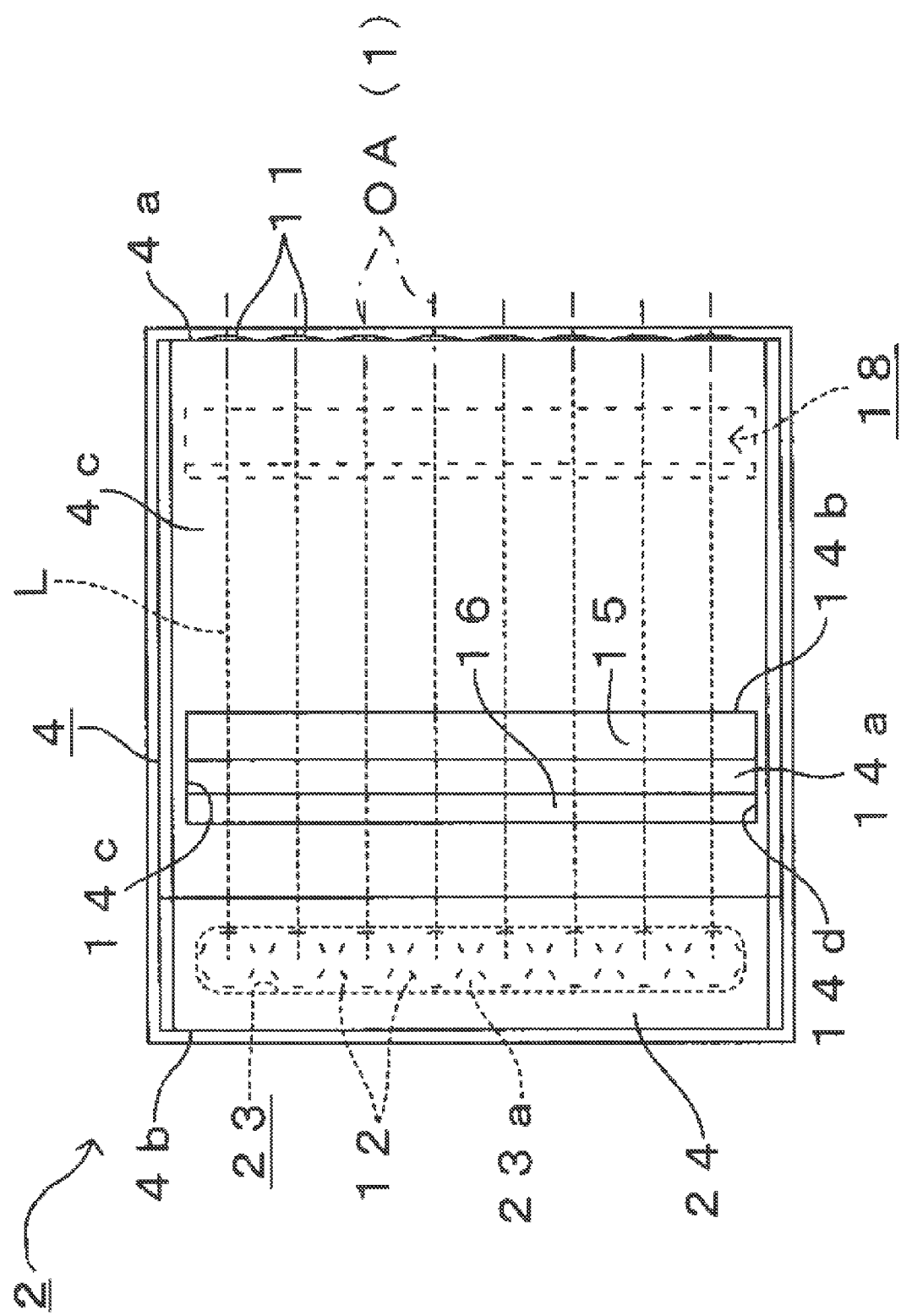
FIG. 7 is a plan view showing a lens array according to Embodiment 2 of the lens array and an optical module with this lens array of the present invention.
Figure 8:
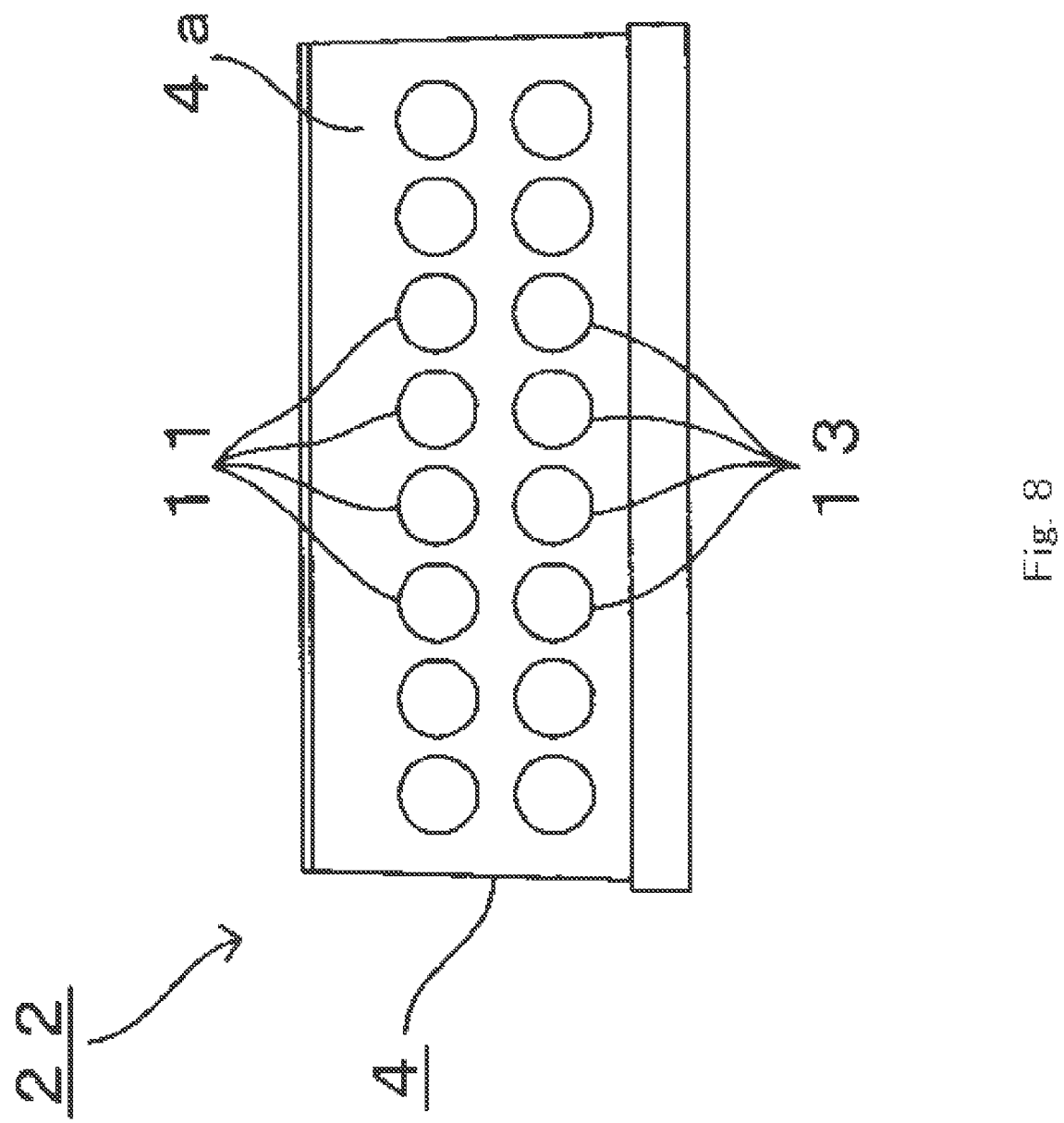
FIG. 8 is a right-side view of FIG. 7.
Figure 9:
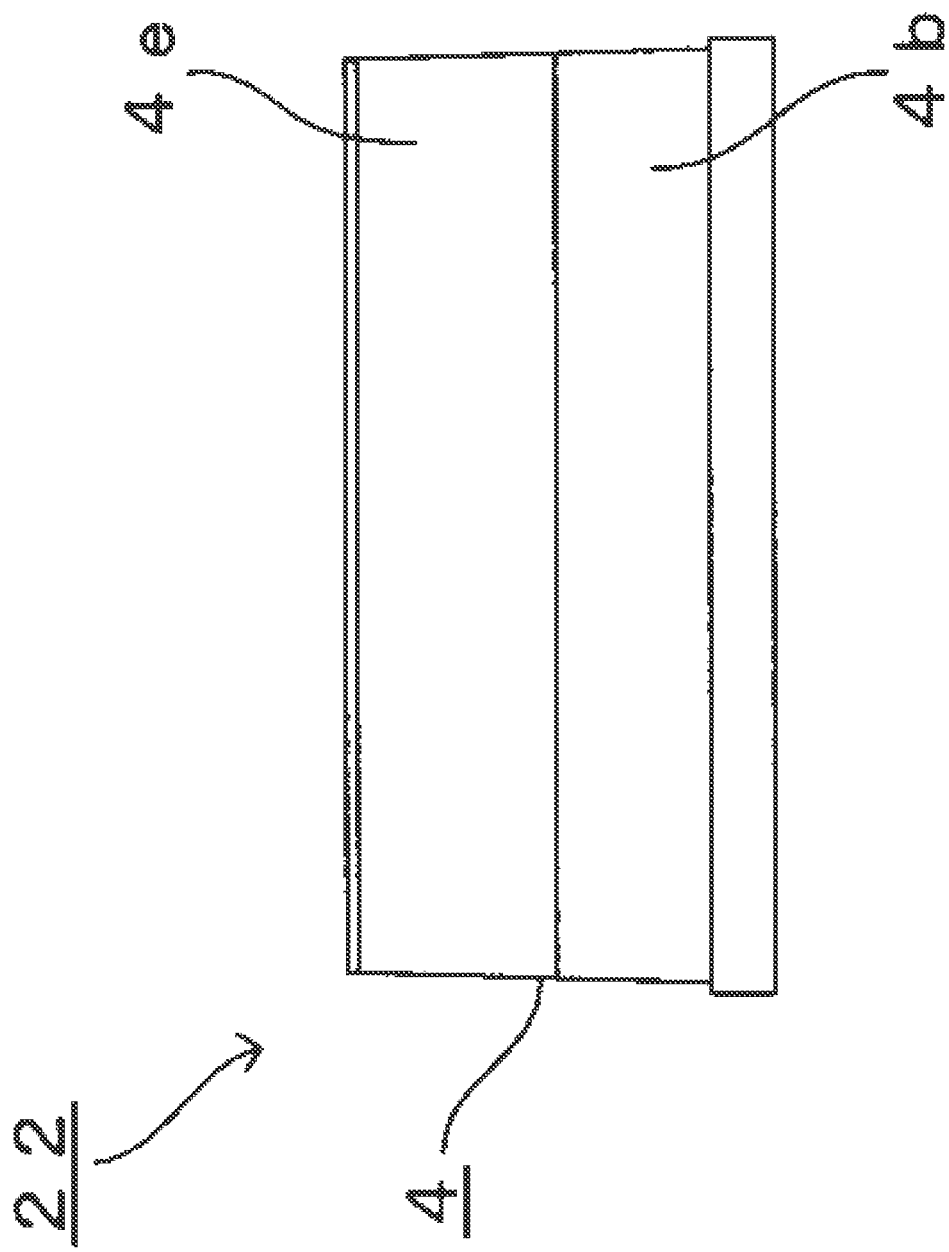
FIG. 9 is a left-side view of FIG. 7.
Figure 10:
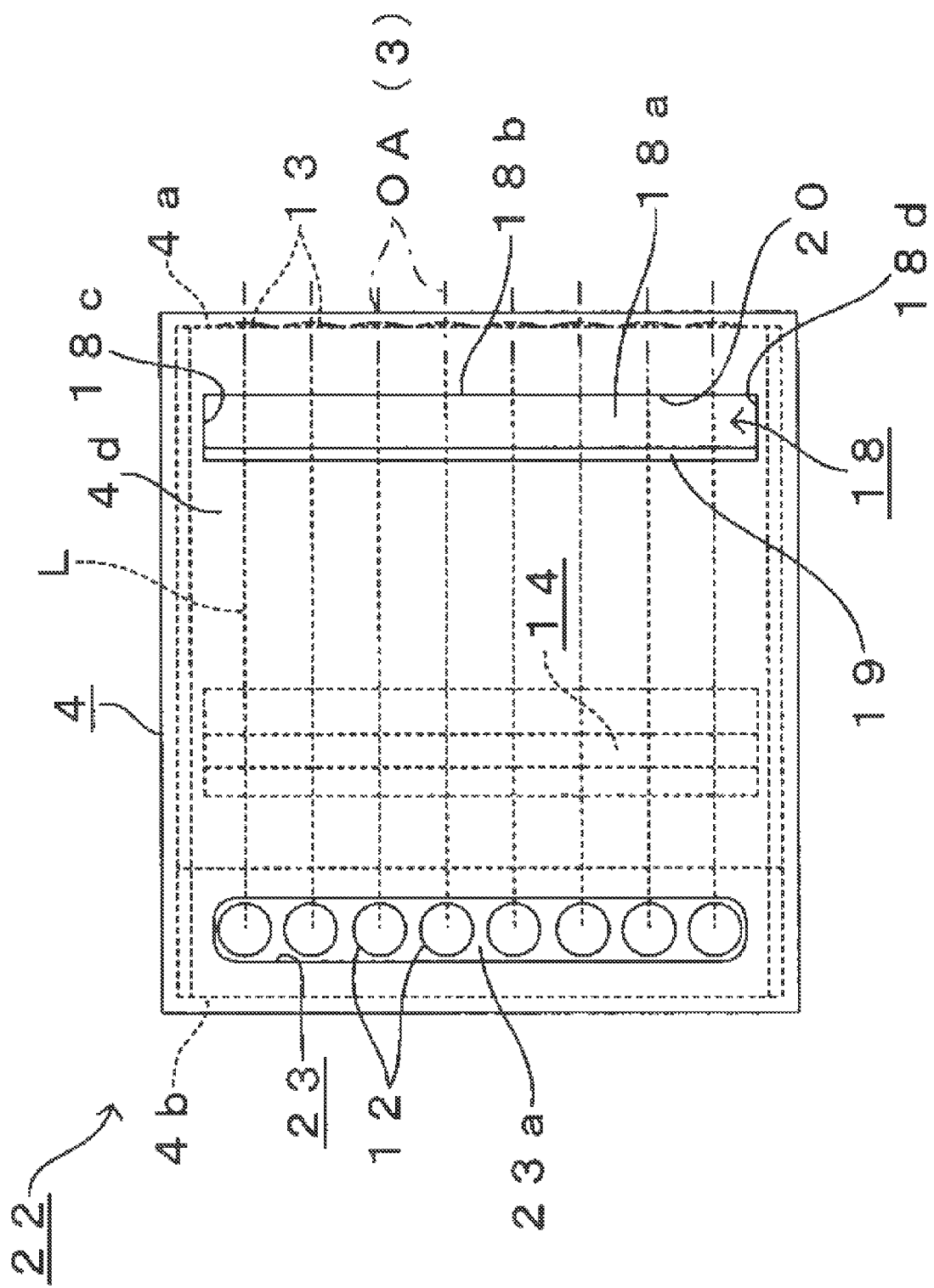
FIG. 10 is a bottom view of FIG. 7.

FIG. 6 is a schematic configuration diagram showing an overview of optical module 21 of the present embodiment and a vertical cross-sectional view of lens array 22 of the present embodiment. FIG. 7 is a plan view of lens array 22 shown in FIG. 6. FIG. 8 is a right-side view of FIG. 7. FIG. 9 is a left-side view of FIG. 7. FIG. 10 is a bottom view of FIG. 7.

Optical module 21 and lens array 22 according to the present embodiment differ from Embodiment 1 in the positions to form second lens surfaces 12 of lens array body 4, the positions to arrange optical fibers 5 and the configuration on the optical paths connecting first lens surfaces 11 and second lens surfaces 12 after first concave part 14.

As shown in FIG. 6 and FIG. 10, with the present embodiment, second lens surfaces 12 are formed in bottom surface 23a (i.e. the second surface with the present embodiment) of counterbore part 23 formed in lower end surface 4d of lens array body 4.

Further, as shown in FIG. 6, with the present embodiment, optical fibers 5 are arranged in the positions to face these second lens surfaces 12 from below.

Further, as shown in FIG. 6, lens array body 4 has total reflecting surface 4e in the upper left end part in FIG. 6. Total reflecting surface 4e is an inclined surface having the angle of 45 degrees in the counter-clockwise direction in FIG. 6, based on the horizontal direction (i.e. 0 degree) in FIG. 6. Further, reflecting film 24 made of, for example, Au, Ag and Al, is coated with total reflecting surface 4e.

Further, with the present embodiment, lens array body 4 is formed such that optical axes OA (1) on first lens surfaces 11 and optical axes OA (2) on second lens surfaces 12 are vertical.

Furthermore, with the present embodiment, bottom surface 23a of counterbore part 23 and lower end surface 4d of lens array body 4 are formed in a flat surface vertical to optical axes OA (2) on second lens surfaces 12.

Then, with the present embodiment, laser light L having transmitted through first refracting surface 16 travels leftward in FIG. 6 and is incident on total reflecting surface 4e, and is totally reflected in this total reflecting surface 4e downward in FIG. 6 at the right angle. Further, each laser light L having been totally reflected on total reflecting surface 4e is incident on each applicable second laser surface 12. Then, each laser light L having been incident on each second lens surface 12 is emitted by each second lens surface 12 toward the end surface of each optical fiber 5 matching each light emitting element 7.

The other configurations are the same as the configurations described in Embodiment 1.

According to this configuration, similar to Embodiment 1, it is possible to branch each laser light L having been incident on first lens surface 11, toward second lens surfaces 12 and third lens surfaces 13 by reflecting/transmission surface 15, and emit monitor lights M branched toward the third lens surfaces 13, toward light emitting elements 8 from third lens surfaces 13 through second refracting surface 19, so that it is possible to have monitor lights M reliably.

Further, first refracting surface 16 and total reflecting surface 4e are formed such that optical axes OA (1) on first lens surfaces 11 and optical axes OA (2) on second lens surfaces 12 are vertical, and second refracting surface 19 is formed such that optical axes OA (1) on first lens surfaces 11 and optical axes OA (3) on third lens surfaces 13 are parallel. By this means, it is possible to relax accuracy in measuring required by lens array 2 to secure the optical paths connecting light emitting elements 7 and light receiving elements 8 and the optical paths connecting light emitting elements 7 and the end surfaces of optical fibers 5, and manufacture lens arrays easily. If the lens array is formed such that optical axes OA (2) on second lens surfaces 12 have an acute inclination with respect to optical axes OA (1) on first lens surfaces 11, a little measurement error in the vertical direction in FIG. 1 produces the possibility that laser lights L emitted from second lens surfaces 12 are not coupled to the end surfaces of optical fibers 5. By contrast with this, with the present embodiment, even if a little measurement error occurs in lens array 2 in the vertical direction in FIG. 1, laser lights M emitted from second lens surfaces 12 slightly increase or decrease their beam diameters with respect to the design value, so that lights are adequately coupled to the end surfaces of optical fibers 5. Consequently, with lens array 22 according to the present embodiment, it is possible to set a great tolerance compared to the configuration disclosed in Patent Literature 2.

(Embodiment 3)

Next, the difference of Embodiment 3 of a lens array and an optical module with this lens array of the present invention from above Embodiment 1 will be mainly explained with reference to FIG. 11 to FIG. 15.

Figure 11:
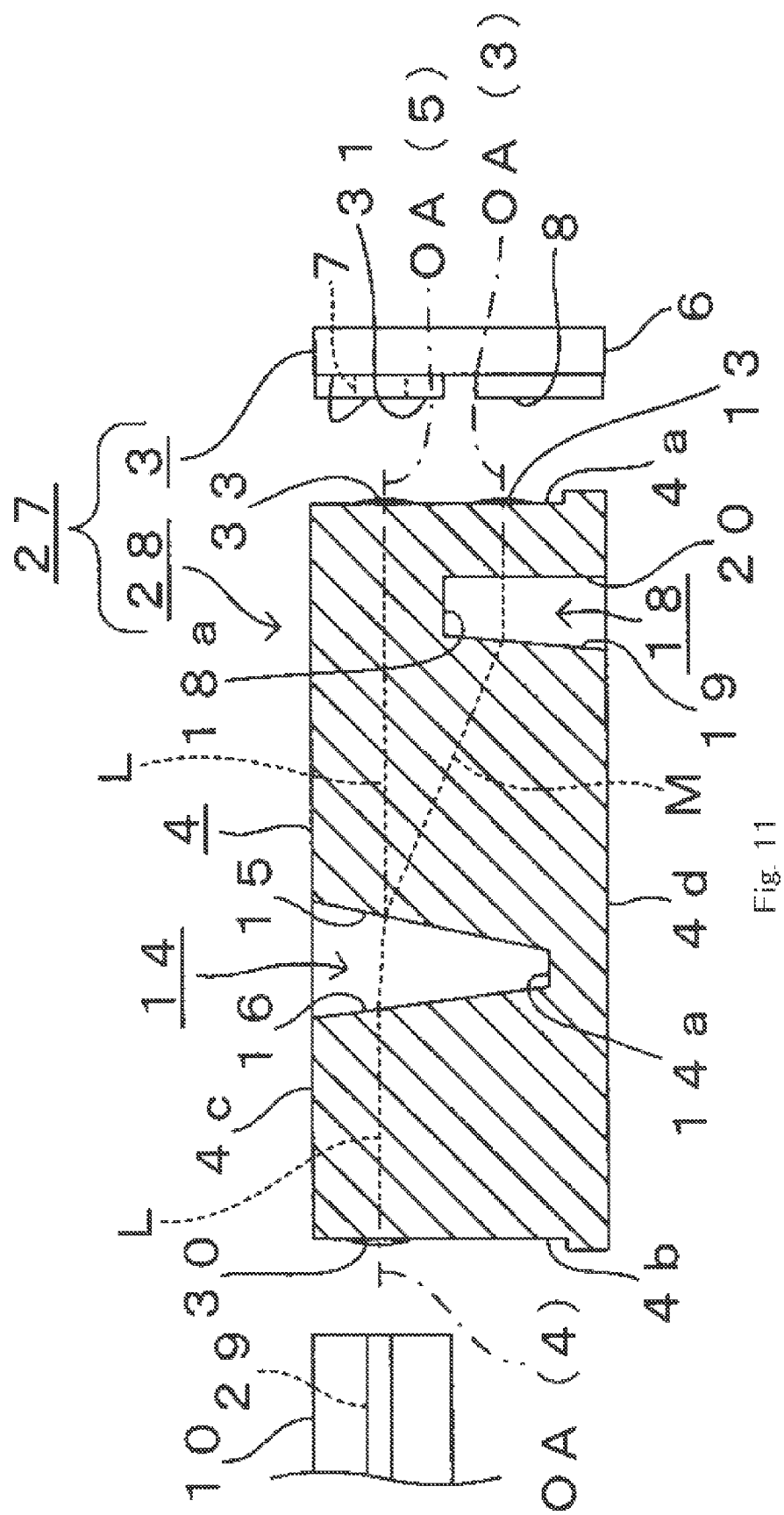
FIG. 11 is a schematic configuration diagram showing an overview of an optical module and a vertical cross-sectional view of a lens array according to Embodiment 3 of the lens array and the optical module with this lens array of the present invention.
Figure 12:
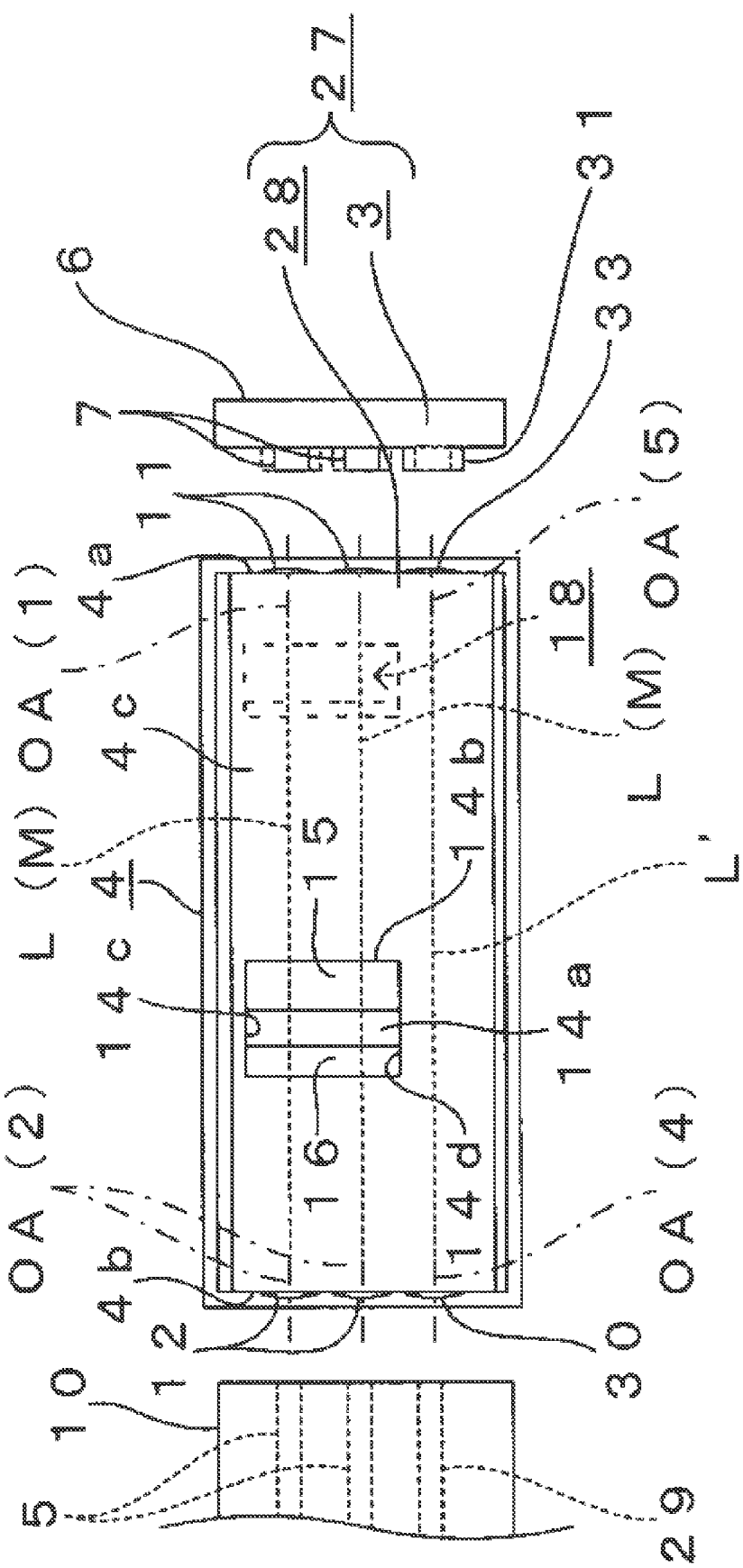
FIG. 12 is a plan view of FIG. 11.
Figure 13:
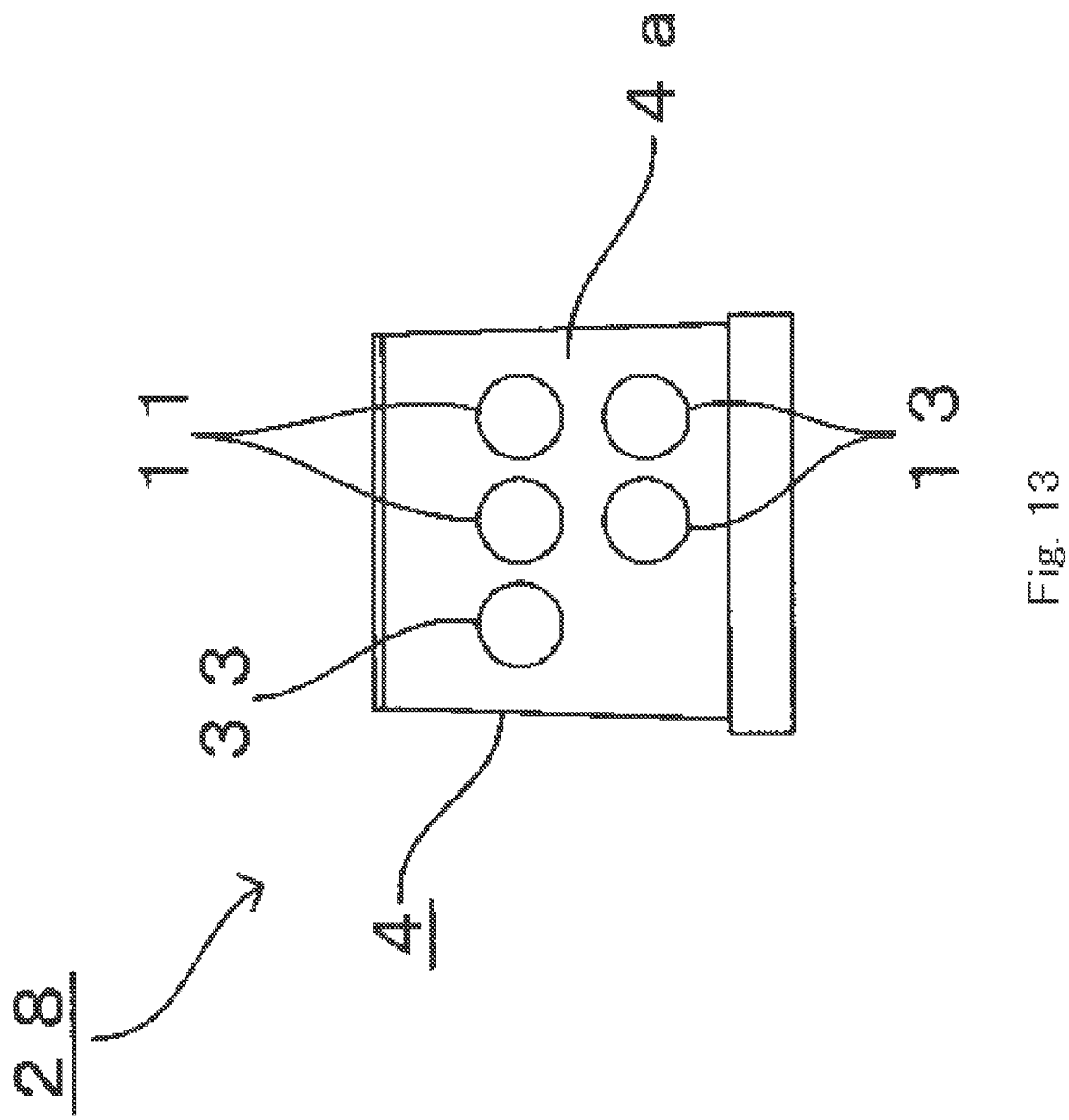
FIG. 13 is a right-side view showing a lens array according to Embodiment 3 of the lens array and an optical module with this lens array of the present invention.
Figure 14:
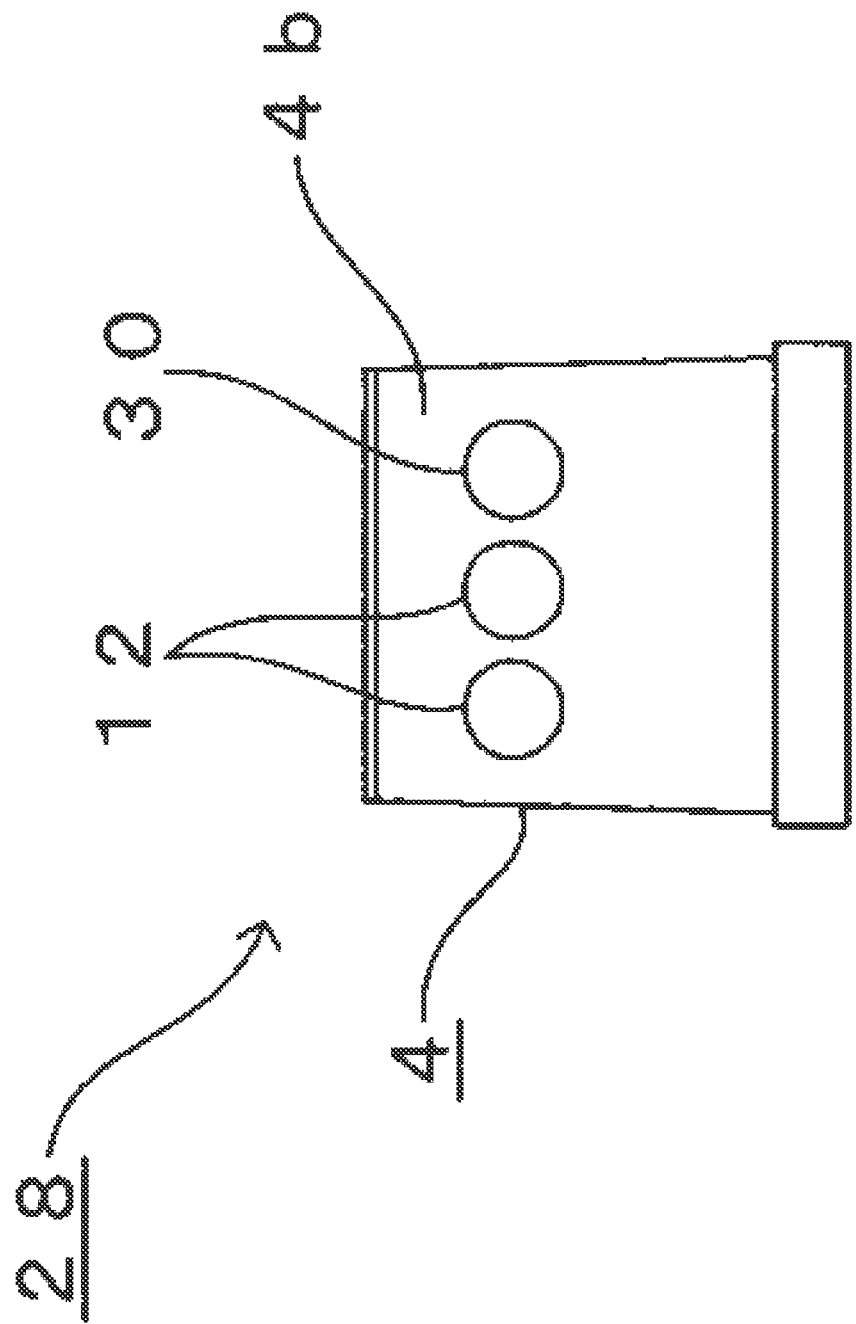
FIG. 14 is a left-side view showing a lens array according to Embodiment 3 of the lens array and an optical module with this lens array of the present invention.
Figure 15:
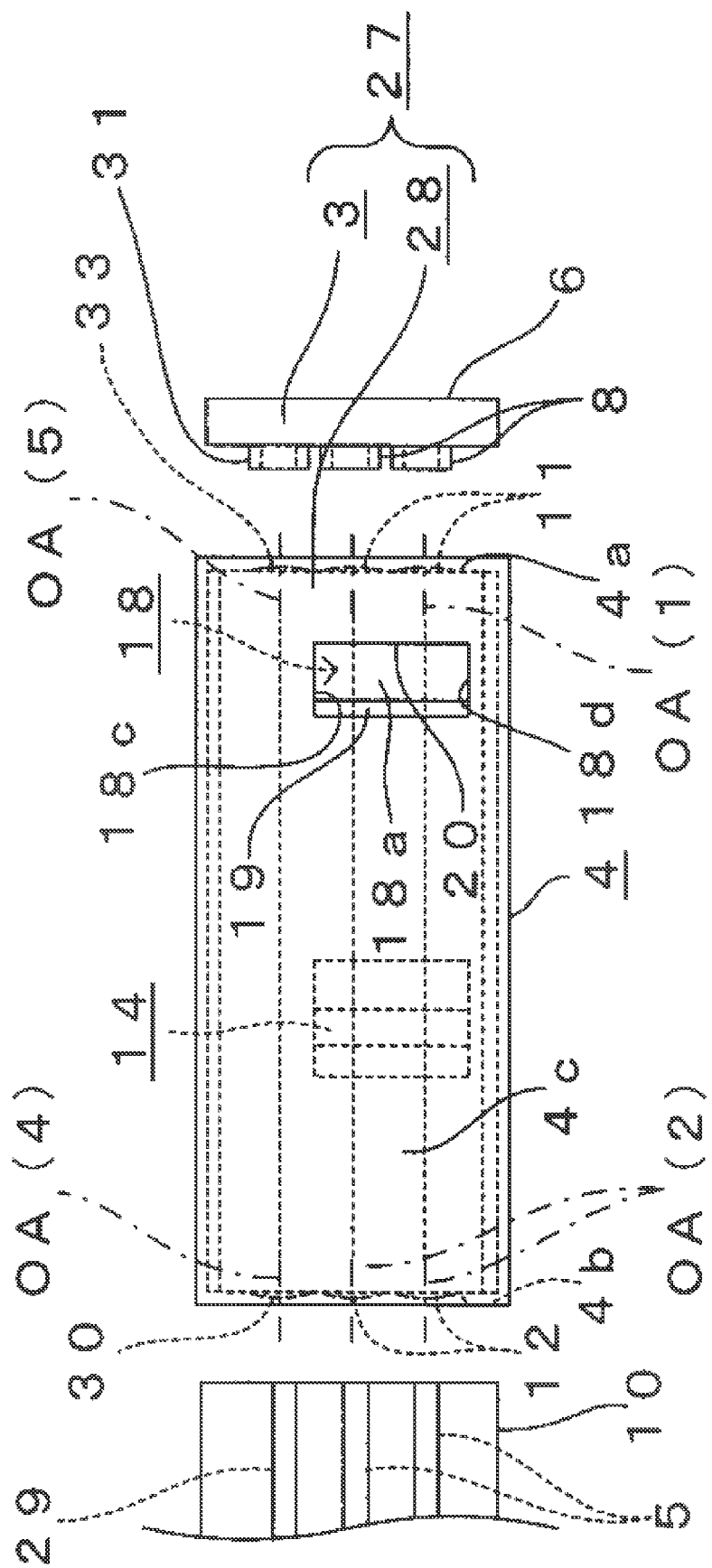
FIG. 15 is a bottom view of FIG. 11.

FIG. 11 is a schematic configuration diagram showing an overview of optical module 27 of the present embodiment and a vertical cross-sectional view of lens array 28 of the present embodiment. FIG. 12 is a plan view of FIG. 11. FIG. 13 is a right-side view of lens array 28 shown in FIG. 12. FIG. 14 is a left-side view of lens array 28 shown in FIG. 12. FIG. 15 is a bottom view of FIG. 11.

Optical module 27 and lens array 28 according to the present embodiment differ from Embodiment 1 that only supports transmission alone, in the configuration that supports transmission and reception.

That is, with the present embodiment, as shown in FIG. 12, second optical fiber 29 (i.e. second laser source) that emits light toward lens array body 4 is arranged together with first optical fibers 5, in positions to face left end surface 4b in lens array body 4. Note that second optical fiber 29 is held together with first optical fibers 5 inside bulk multicore connector 10. Note that, with the present embodiment, the number of second optical fibers 29 is one and the number of optical fibers 5 is two. Further, second optical fiber 29 is formed to have the same diameter as first optical fibers 5, and the center of the end surface of second optical fiber 29 is arranged in a position on the extension of the line connecting the centers of the end surfaces of first optical fibers 5.

Further, with the present embodiment, as shown in FIG. 15, photoelectric converting device 3 has first light emitting elements 8 and, in addition, second light receiving element 31 that receives light emitted from second optical fiber 29.

Further, with the present embodiment, as shown in FIG. 12 and FIG. 14, fourth lens surface 30 (i.e. convex lens surface) having a circular shape from a plan view is formed in the position on left end surface 4b to face second optical fiber 29 of lens array body 4. Optical axis OA (4) on this fourth lens surface 30 is parallel to optical axes OA (2) on second lens surfaces 12, and matches the center axis of the end surface of second optical fiber 29. Light L' having been emitted from the end surface of second optical fiber 29 is incident on this fourth lens surface 30. Then, fourth lens surface 30 collimates and allows incident light L' to travel toward the interior of lens array body 4.

Further, with the present embodiment, as shown in FIG. 12 and FIG. 13, fifth lens surface 33 (i.e. convex lens surface) having a circular shape from a plan view is formed in the position on right end surface 4a to face second light receiving element 31 of lens array 4. Optical axis OA (5) on this fifth lens surface 33 is parallel to optical axes OA (1) on first lens surfaces 11. Light L' having been incident on fourth lens surface 30 and traveled inside lens array body 4 is incident on this fifth lens surface 33. Then, fifth lens surface 33 emits incident light L' toward second light emitting element 31, so that second light emitting element 31 receives lights L'.

By this means, with the present embodiment, optical module 27 and lens array 28 can not only transmit optical signals (i.e. laser light L) through first lens surfaces 11 and second lens surfaces 12, but also receive optical signals (i.e. laser light L') through fourth lens surface 30 and fifth lens surface 33.

Further, with the present embodiment, as shown in FIG. 12 and FIG. 15, first concave part 14 and second concave part 18 are formed in positions outside the optical path connecting fourth lens surface 30 and fifth lens surface 33.

According to this configuration, it is not necessary to design the optical path connecting fourth lens surface 30 and fifth lens surface 33 taking into account the presences of first concave part 14 and second concave part 18, and, consequently, it is possible to easily manufacture lens arrays 28 supporting bidirectional communication.

The other configurations are the same as the configurations described in Embodiment 1.

(Embodiment 4)

Next, the difference of Embodiment 4 of a lens array and an optical module with this lens array of the present invention from above Embodiment 1 will be mainly explained with reference to FIG. 16 to FIG. 18.

Figure 16:
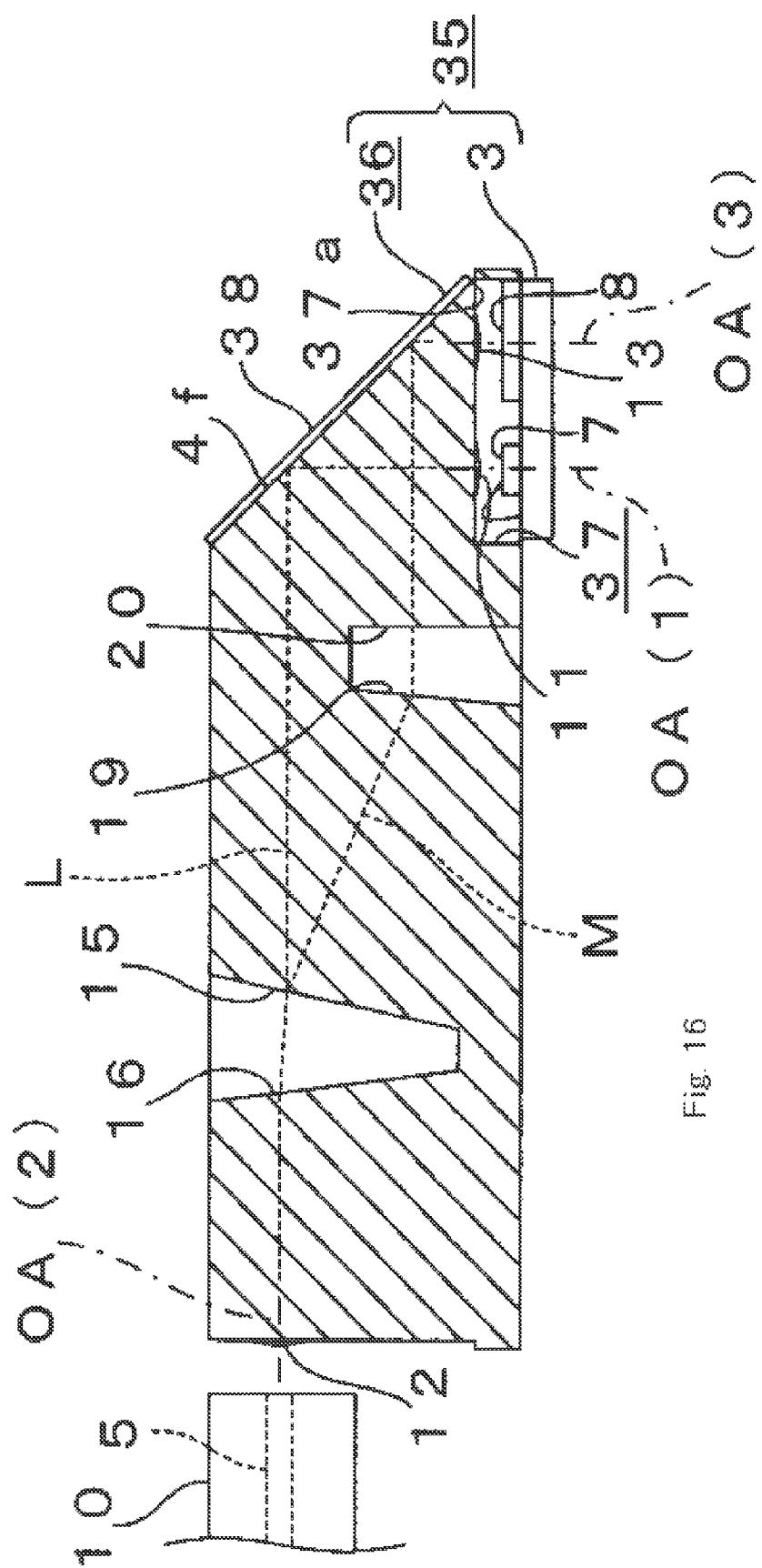
FIG. 16 is a schematic configuration diagram showing an overview of an optical module and a vertical cross-sectional view of a lens array according to Embodiment 4 of the lens array and the optical module with this lens array of the present invention.

FIG. 16 is a schematic configuration diagram showing an overview of optical module 35 of the present embodiment and a vertical cross-sectional view of lens array 36 of the present embodiment. FIG. 17 is a plan view of lens array 36 shown in FIG. 16. FIG. 18 is a bottom view of FIG. 17.

Optical module 35 and lens array 36 according to the present embodiment differ from Embodiment 1 in the positions to form first lens surfaces 11 and third lens surfaces 13 of lens array body 4, the position to arrange photoelectric converting device 3, the configuration on the optical paths connecting first lens surfaces 11 and second lens surfaces 12 before first concave part 14 and the configuration on the optical paths connecting first lens surfaces 11 and third lens surface 13 after second concave part 18.

Figure 17:
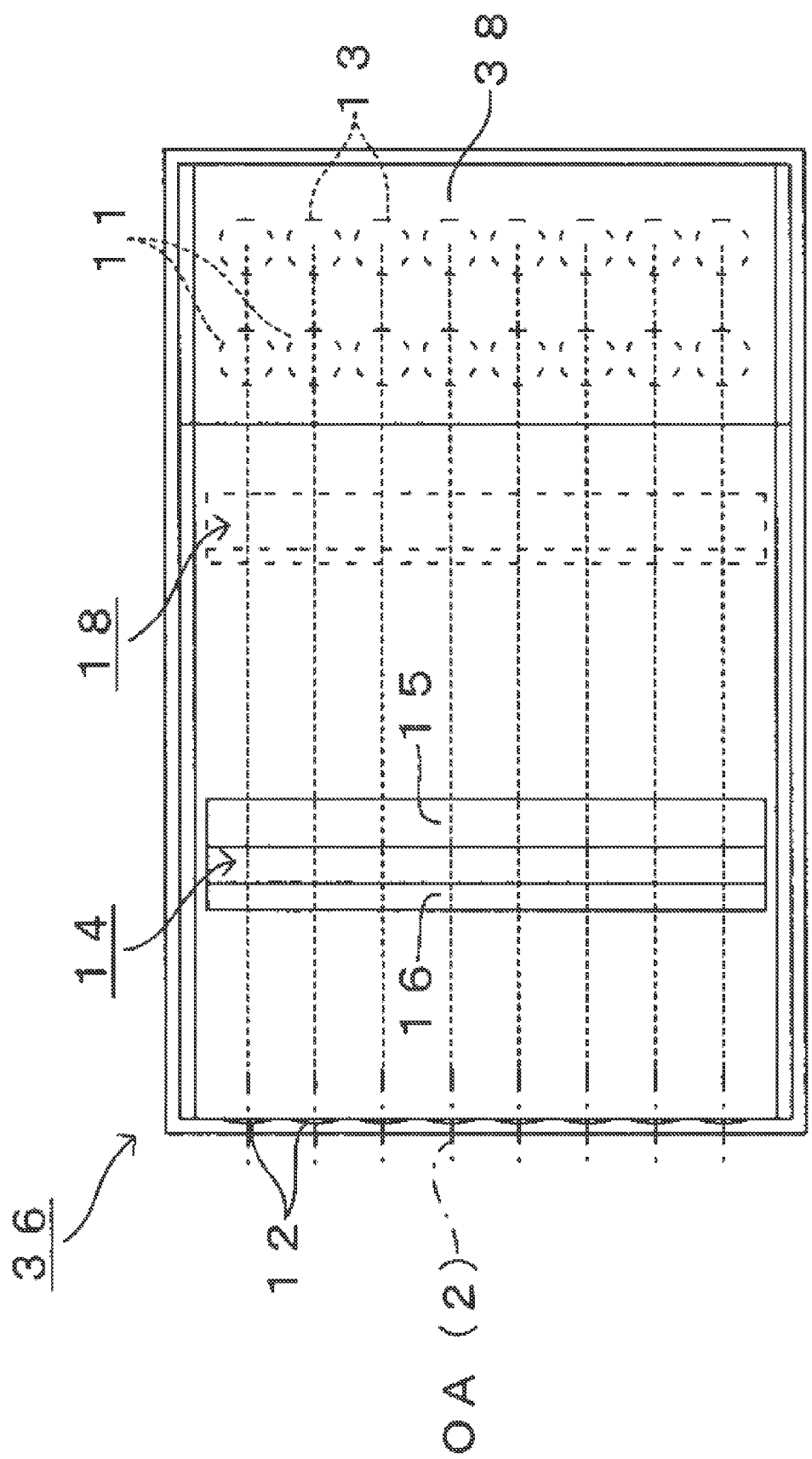
FIG. 17 is a plan view showing a lens array according to Embodiment 4 of the lens array and an optical module with this lens array of the present invention.
Figure 18:
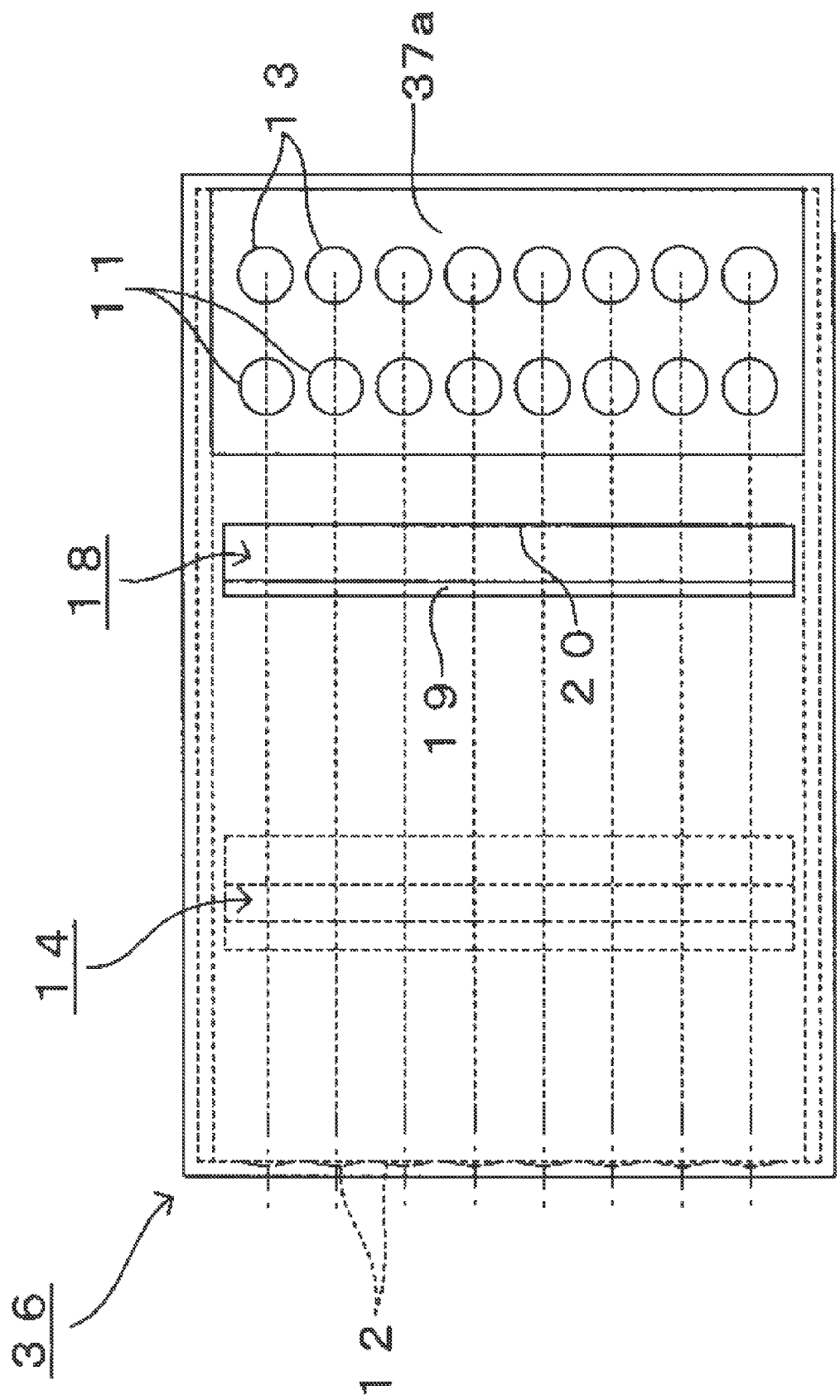
FIG. 18 is a bottom view of FIG. 17.

That is, with the present embodiment, as shown in FIG. 16 to FIG. 18, first lens surfaces 11 and third lens surfaces 13 are formed in bottom surface 37a of counterbore part 37 formed by providing a dent in the right end part of lower end surface 4d of lens array body 4 in FIG. 16. Then, lens array 36 is formed such that optical axes OA (1) on first lens surfaces 11 and optical axes OA (3) on third lens surfaces 13 are parallel to the vertical direction in FIG. 16.

Further, accompanying this, photoelectric converting device 3 is arranged in the position to face these first lens surfaces 11 and third lens surfaces 13 from below.

Further, as shown in FIG. 16, lens array body 4 has total reflecting surface 4f in the upper end part in FIG. 16, and this total reflecting surface 4f is formed in an inclined surface having the angle of 45 degrees in the clockwise direction in FIG. 16, based on the horizontal direction (i.e. 0 degree) in FIG. 16. Further, reflecting film 38 made of, for example, Au, Ag and Al, is coated with total reflecting surface 4f.

Further, with the present embodiment, lens array 36 is formed such that optical axes OA (1) on first lens surfaces 11 and optical axes OA (2) on second lens surfaces 12 are vertical.

Further, with the present embodiment, bottom surface 37a of counterbore part 37 and lower end surface 4d of lens array body 4 are formed in the flat surface vertical to optical axes OA (1) on first lens surfaces 11 and optical axes OA (3) on third lens surfaces 13.

Then, with the present embodiment, laser light L is emitted in an upward direction in FIG. 16, from each light emitting element 7 in photoelectric converting device 3, and this emitted laser light L is incident on each applicable first lens surface 11.

Each laser light L having been incident on each first lens surface 11 is collimated by each first lens surface 11, travels inside lens array body 4 upward in FIG. 16, then is incident on total reflecting surface 4f and is totally reflected on total reflecting surface 4f leftward in FIG. 16.

Each laser light L totally reflected on total reflecting surface 4f travels leftward in FIG. 16, and, similar to Embodiment 1, large part of lights are refracted and transmitted through reflecting/transmission surface 15 toward second lens surfaces 12 as lights to be coupled to optical fibers 5, and the rest of lights are reflected at a predetermined reflectivity toward third lens surfaces 13 as monitor lights M of each light emitting element 7.

Each monitor light M having been reflected on reflecting/transmission surface 15 travels inside lens array body 4, then is refracted on second refracting surface 19, further transmits through transmission surface 20 and then is incident on total reflecting surface 4f.

Then, each monitor light M having been incident on total reflecting surface 4f is totally reflected on total reflecting surface 4f downward in FIG. 16 and then is received by each light receiving element 8 through each third lens surface 13 matching each light emitting element 7.

The other configurations are the same as the configurations described in Embodiment 1.

According to this configuration, similar to Embodiment 1, it is possible to branch each laser light L having been incident on first lens surfaces 11 by reflecting/transmission surface 15, toward second lens surfaces 12 and third lens surfaces 13, and emit monitor lights M branched toward third lens surfaces 13 by third lens surfaces 13, toward light emitting elements 13 through second refracting surface 19, so that it is possible to have monitor lights M reliably.

Further, lens array 36 is formed such that optical axes (1) on first lens surfaces 11 and optical axes OA (3) on third lens surfaces 13 are parallel, and optical axes OA (1) on first lens surfaces 11 and optical axes OA (2) on second lens surfaces 12 are vertical, so that it is possible to relax accuracy in measuring required by lens array 2 to secure the optical paths connecting light emitting elements 7 and the end surfaces of optical fibers 5, and manufacture lens arrays easily.

Note that the present invention is not limited to the above-described embodiments, and can be variously modified if necessary.

INDUSTRIAL APPLICABILITY

The lens array and the optical module with this lens array according to the present invention can be used widely in multi-channel optical communication using optical fibers.

REFERENCE SIGNS LIST

1 OPTICAL MODULE
2 LENS ARRAY
3 PHOTOELECTRIC CONVERTING DEVICE
4 LENS ARRAY BODY
5 OPTICAL FIBER
7 LIGHT EMITTING ELEMENT
8 LIGHT RECEIVING ELEMENT
11 FIRST LENS SURFACE
12 SECOND LENS SURFACE
13 THIRD LENS SURFACE
14 FIRST CONCAVE PART
15 REFLECTING/TRANSMISSION SURFACE
16 FIRST REFRACTING SURFACE
18 SECOND CONCAVE PART
19 SECOND REFRACTING SURFACE

The invention claimed is:

1. A monolithic lens array comprising:
    a plurality of first lens surfaces on which a plurality of lights each emitted from a plurality of light emitting elements arranged in parallel are incident;
    a reflecting/transmission surface which reflects part of lights emitted from the plurality of first lens surfaces, and allows a rest of lights to transmit;
    a first refracting surface which refracts traveling directions of the lights transmitted through the reflecting/transmission surface, so as to be parallel to the lights emitted from the plurality of first lens surfaces;
    a first concavity between the reflecting/transmission surface and the first refracting surface such that the lights transmitted through the reflecting/transmission surface to the first refracting surface travel through the first concavity;
    a plurality of second lens surfaces which emit the lights refracted on the first refracting surface, toward end surfaces of a plurality of optical fibers arranged in parallel;
    a second refracting surface which refracts traveling directions of the lights reflected on the reflecting/transmission surface, so as to be parallel to the lights emitted from the plurality of first lens surfaces; and
    a transmission surface which allows the refracted lights from the second refracting surface to pass through the transmission surface;
    a second concavity between the second refracting surface and the transmission surface such that the lights reflected from the reflecting/transmission surface to the transmission surface travel through the second concavity; and
    one or a plurality of third lens surfaces which emit the lights refracted on the second refracting surface, toward light receiving elements.

2. The monolithic lens array according to claim 1, further comprising a total reflecting surface which changes traveling directions of the lights refracted on the first refracting surface by ninety degrees,
    wherein the plurality of second lens surfaces emit the lights having been refracted on the first refracting surface and having changed the traveling directions on the total reflecting surface, toward the light receiving elements.

3. The monolithic lens array according to claim 1, wherein the second refracting surface is formed in a position outside optical paths from the first lens surfaces and the second lens surfaces.

4. The monolithic lens array according to claim 1 further comprising:
    a fourth lens surface on which light emitted from an end surface of a second optical fiber arranged in parallel to the optical fibers is incident; and
    a fifth lens surface which emits light emitted from the fourth lens surface, toward a second light receiving element.

5. The monolithic lens array according to claim 4, wherein the reflecting/transmission surface, the first refracting surface and the second refracting surface are formed in positions outside an optical path from the fourth lens surface to the fifth lens surface.

6. The monolithic lens array according to claim 1, wherein the first concavity and the second concavity gradually reduce cross section areas toward depths from opening parts.

7. The monolithic lens array according to claim 1 which is formed integrally using a single material.

8. An optical module comprising:

the monolithic lens array according to claim 1; and a photoelectric converting device which comprises the plurality of light emitting elements, and which converts an optical signal to an electrical signal and converts an electrical signal to an optical signal.

\* \* \* \* \*